(12) United States Patent
Jun et al.

(10) Patent No.: US 12,389,775 B2
(45) Date of Patent: Aug. 12, 2025

(54) DISPLAY DEVICE AND DISPLAY PANEL

(71) Applicant: LG DISPLAY CO., LTD., Seoul (KR)

(72) Inventors: Sungwoo Jun, Gyeonggi-do (KR); Byeong-Seong So, Seoul (KR)

(73) Assignee: LG Display Co., Ltd. (KR)

( * ) Notice: Subject to any disclaimer, the term of this patent is extended or adjusted under 35 U.S.C. 154(b) by 575 days.

(21) Appl. No.: 17/875,759

(22) Filed: Jul. 28, 2022

(65) Prior Publication Data
US 2023/0075883 A1    Mar. 9, 2023

(30) Foreign Application Priority Data

Sep. 6, 2021    (KR) .................... 10-2021-0118688

(51) Int. Cl.
*H10K 59/131*    (2023.01)
*H10K 59/40*    (2023.01)
*H10K 59/65*    (2023.01)

(52) U.S. Cl.
CPC ......... *H10K 59/1315* (2023.02); *H10K 59/40* (2023.02); *H10K 59/65* (2023.02)

(58) Field of Classification Search
None
See application file for complete search history.

(56) References Cited

U.S. PATENT DOCUMENTS

| | | | |
|---|---|---|---|
| 2020/0194461 A1 | 6/2020 | Park et al. | |
| 2020/0365674 A1 | 11/2020 | Jeon et al. | |
| 2021/0126076 A1 | 4/2021 | Lee et al. | |
| 2023/0064771 A1* | 3/2023 | Cho | ...................... G09G 3/3233 |

FOREIGN PATENT DOCUMENTS

CN            107977114 A        5/2018

OTHER PUBLICATIONS

Extended European search report dated Jan. 18, 2023 issued in Patent Application No. 22186890.4 (11 pages).

\* cited by examiner

*Primary Examiner* — Kyoung Lee
(74) *Attorney, Agent, or Firm* — Fish & Richardson P.C.

(57) ABSTRACT

A display panel of a display device includes a display area including a first optical area overlapping with a first optical electronic device and a normal area located outside of the first optical area, the first optical area includes a plurality of light emitting areas and a plurality of first transmission areas, and the normal area may include a plurality of light emitting areas, a plurality of signal lines may include a first horizontal line including a first optical horizontal line portion disposed in the first optical area, and a non-optical horizontal line portion disposed in the normal area, and a second horizontal line disposed in the normal area without being disposed in the first optical area, a first outer horizontal line portion disposed in an outer area in the first optical area has a greater length per unit area compared to other portions thereof, or a width of all or a portion of the first horizontal line may be smaller than a width of the second horizontal line, thereby compensating for an RC load difference between the horizontal lines.

20 Claims, 32 Drawing Sheets

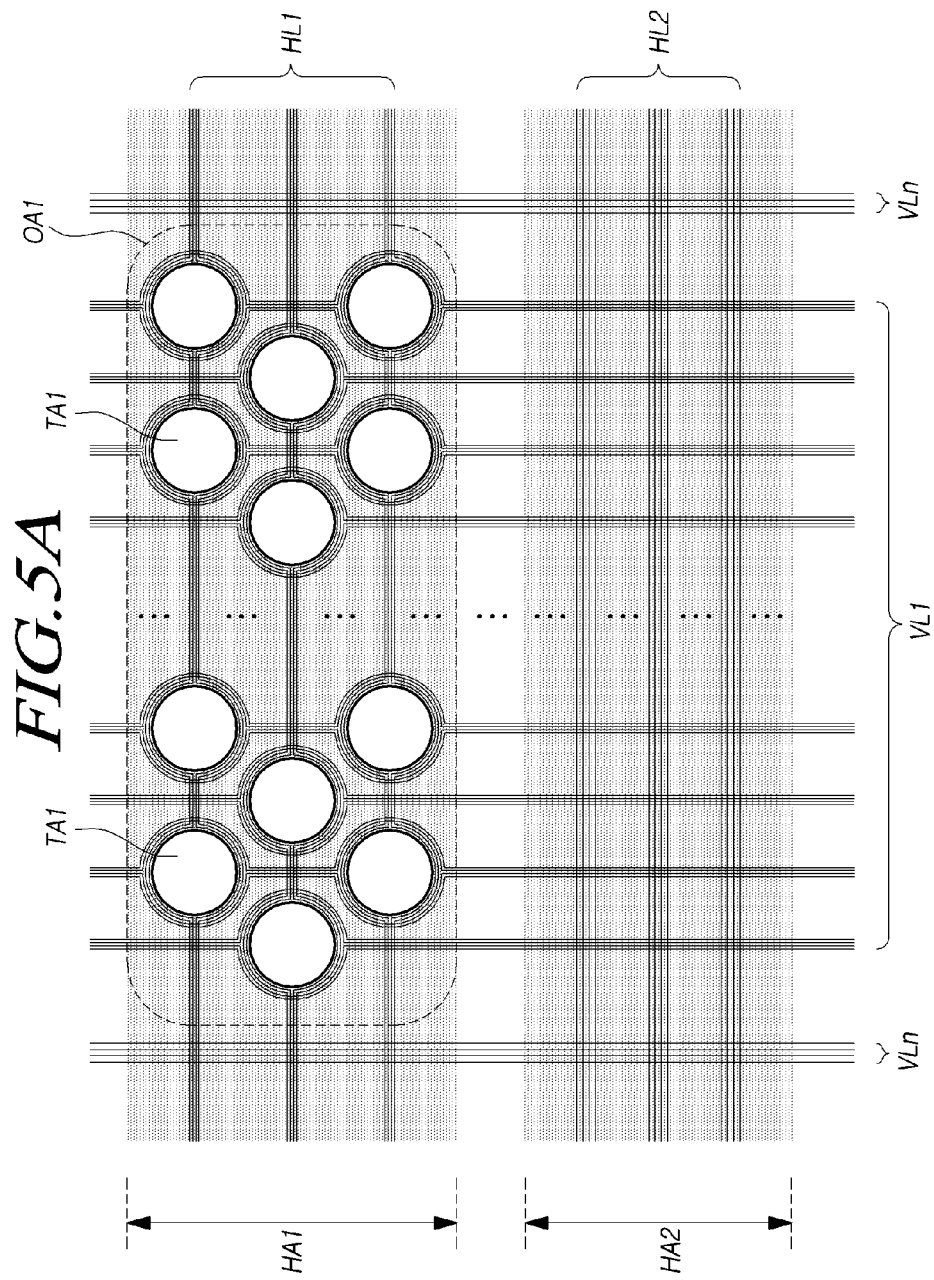

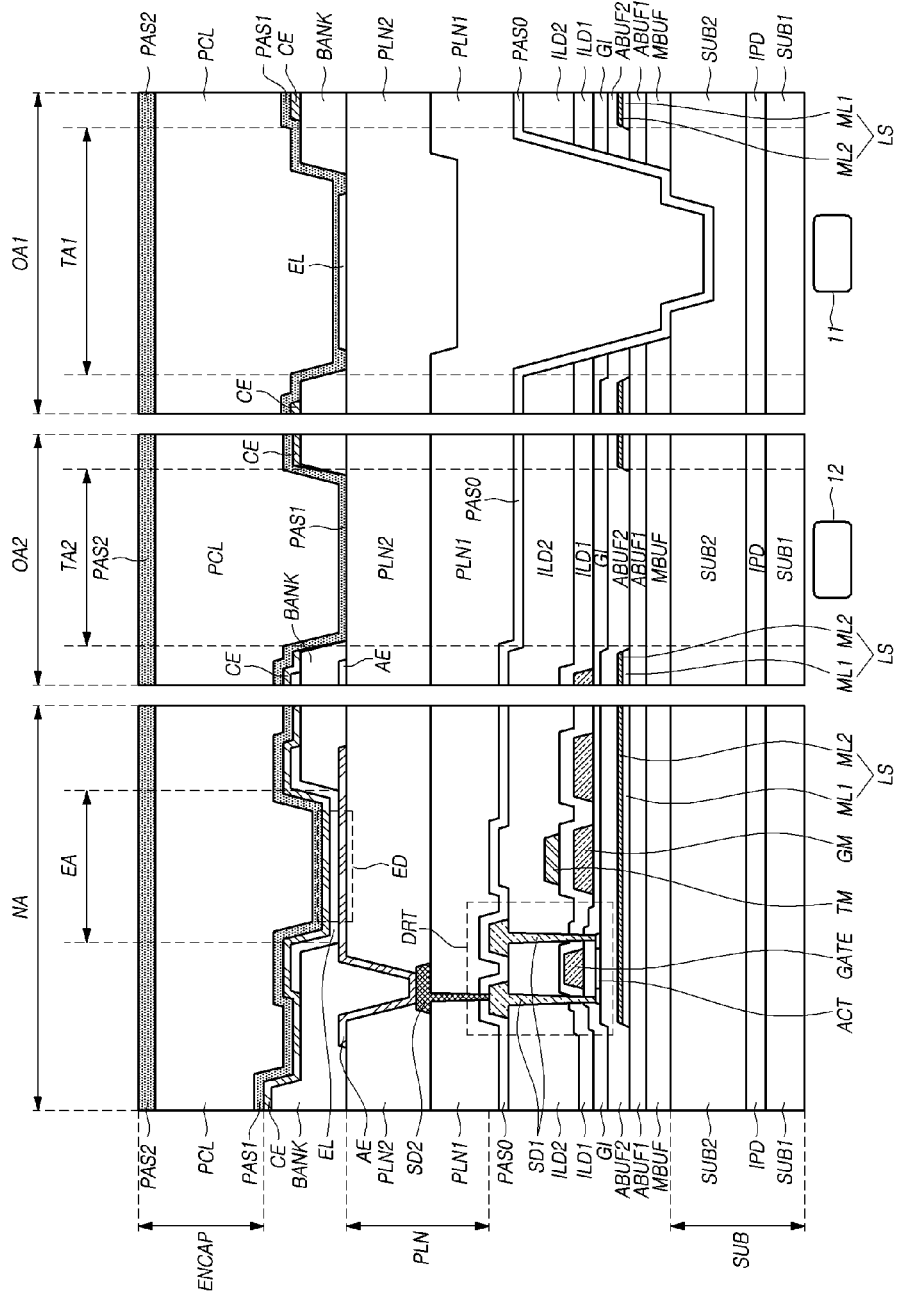

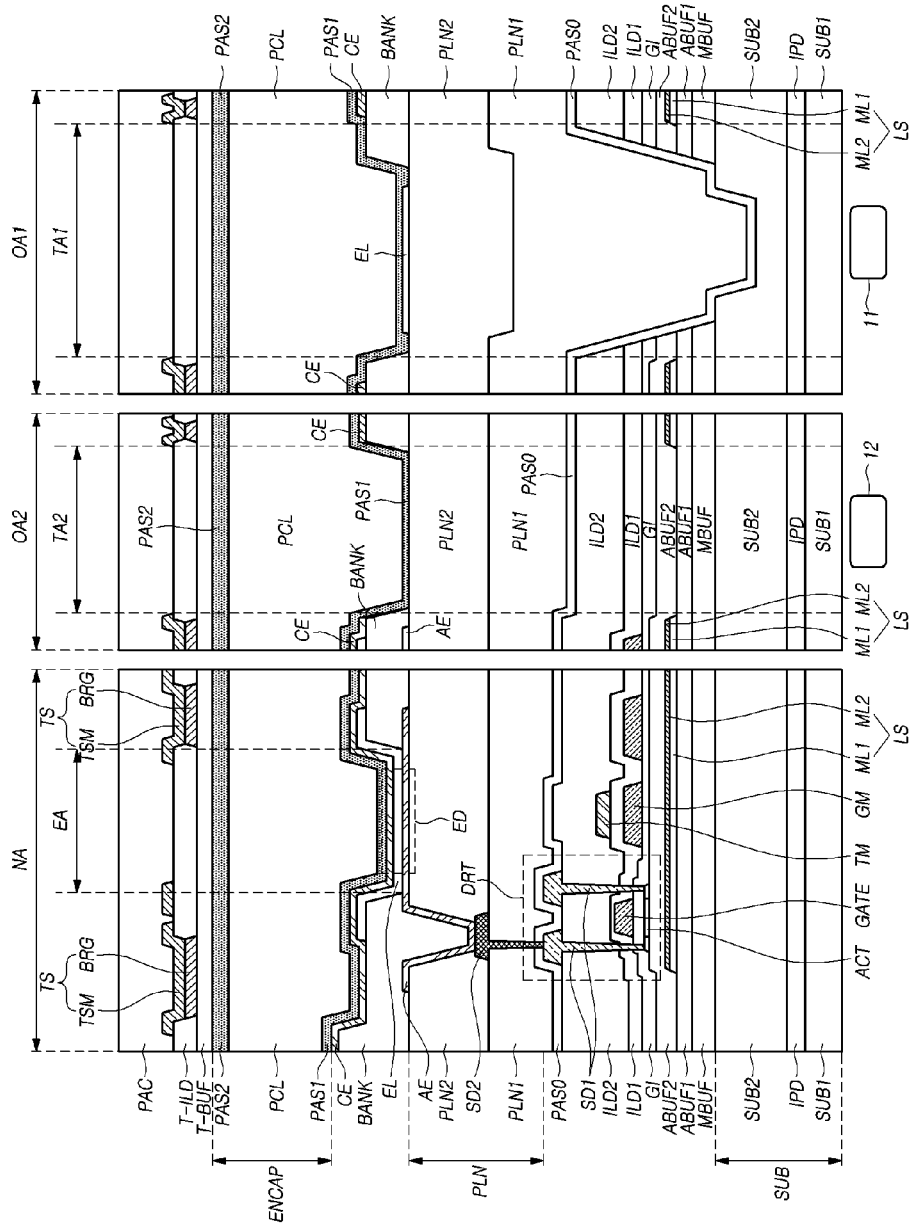

DISPLAY DEVICE AND DISPLAY PANEL

CROSS-REFERENCE TO RELATED APPLICATION

This application claims the priority of Korean Patent Application No. 10-2021-0118688, filed on Sep. 6, 2021, which is hereby incorporated by reference in its entirety.

BACKGROUND

Field of the Disclosure

The present disclosure relates to electronic devices, and more specifically, to a display device and a display panel.

Description of the Background

As display technology advances, display devices can provide increased functions, such as an image capture function, a sensing function, etc., as well as an image display function. To do this, the display device needs to include an optical electronic device (also referred to as a light detector, a light receiver, or a light sensing device), such as a camera, a sensor for detecting images, and/or the like.

In order to receive light passing through the front surface of the display device, it is desirable for the optical electronic device to be located in an area of the display device where incident light coming from the front surface can be advantageously received or detected. Thus, in such a typical display device, the camera (e.g., a camera lens) or/and the sensor for detecting images are generally located in a front portion of the display device in order to be effectively exposed to incident light. According to such an implementation, in order to install the camera and/or the sensor, an increased bezel of the display device is designed, or a notch or a hole is formed in a display area of a display panel of the display device.

Therefore, as the optical electronic device, such as the camera, the sensor, and/or the like, that receives or detects incident light, and performs an intended function is provided in the display device, a size of the bezel in the front portion of the display device may be increased, or a substantial disadvantage may be given in designing the front portion of the display device.

SUMMARY

The present inventors have studied techniques for locating one or more optical electronic devices, such as a camera, a sensor, and/or the like, in a display device without reducing an area of the display area of an associated display panel. Through such study, the inventors have invented a display panel and a display device having a light transmission structure in which even when the optical electronic device is located under the display area of the display panel, and thus, is not exposed in the front surface of the display device, the optical electronic device can normally receive or detect light.

Further, the inventors have found through experiments that in a case where an optical electronic device has a light transmission structure capable of normally receiving light, there occurs a difference in RC loads between a signal line disposed in an optical area overlapping with the optical electronic device in a display area and a signal line disposed in a normal area not overlapping with the optical electronic device in the display area, and to address this issue, have invented a display panel and a display device having a structure capable of compensating for such a difference in RC loads between signal lines.

Accordingly, the present disclosure is to provide to a display panel and a display device that are capable of reducing a non-display area of the display panel and enabling an optical electronic device such as a camera, a sensor, and/or the like not to be exposed in the front surface of the display panel by disposing the optical electronic device under a display area, or at a lower portion, of the display panel.

The present disclosure is also to provide a display panel and a display device that have a light transmission structure for enabling an optical electronic device under the display area, or at a lower portion, of the display panel to normally receive light transmitting the display panel.

The present disclosure is also to provide a display panel and a display device that are capable of normally performing display driving in an optical area included in the display area of the display panel and overlapping with an optical electronic device.

The present disclosure is also to provide a display panel and a display device that have a structure for compensating for a difference in RC loads between a signal line (first horizontal line) disposed in an optical area and a signal line (a second horizontal line) disposed in a normal area in a case where the display area of the display panel includes the optical area overlapping with an optical electronic device and the normal area not overlapping with the optical electronic device.

In the present disclosure, a display device is provided that includes a display panel including a display area and a non-display area and including a plurality of signal lines, and a first optical electronic device located under, or at a lower portion of, the display panel.

The display area may include a first optical area and a normal area located outside of the first optical area. The first optical area may include a plurality of light emitting areas and a plurality of first transmission areas (also called transmissive area). The normal area may include a plurality of light emitting areas.

The first optical electronic device may overlap with at least a portion of the first optical area included in the display area.

The plurality of signal lines may include a first horizontal line including a first optical horizontal line portion disposed in the first optical area and a non-optical horizontal line portion disposed in the normal area, and a second horizontal line disposed in the normal area without being disposed in the first optical area.

The first optical horizontal line portion of the first horizontal line may include a first outer horizontal line portion disposed in an outer area of the first optical area, and a first inner horizontal line portion located inside of the first outer horizontal line portion in the first optical area.

A length per unit area of the first outer horizontal line portion may be greater than a length per unit area of the first inner horizontal line portion, or greater than a length per unit area of the non-optical horizontal line portion, or a width of all or a portion of the first horizontal line may be smaller than a width of the second horizontal line.

The first inner horizontal line portion may be disposed to avoid the plurality of first transmission areas in the first optical area. The first outer horizontal line portion may be disposed in at least one first transmission area disposed in an outer area of the first optical area among the plurality of first transmission areas in the first optical area.

The first outer horizontal line portion may include a resistive compensation pattern having a different shape or a different width from the first inner horizontal line portion.

The resistive compensation pattern may have at least one of a zigzag shape, a spiral shape, and a mesh shape.

The plurality of signal lines may further include a first vertical line intersecting the first horizontal line. The first vertical line may include a first optical vertical line portion disposed in the first optical area, and a first non-optical vertical line portion disposed in the normal area.

The first vertical line may further include a capacitive compensation pattern formed by the expanding or protruding of the first optical vertical line portion.

All or a portion of the capacitive compensation pattern of the first vertical line may overlap with the resistive compensation pattern of the first horizontal line.

According to aspects of the present disclosure, a display panel is provided that includes a substrate including a display area and a non-display area, and a plurality of signal lines disposed over the substrate.

The display area may include a first optical area that at least partially overlaps with a first optical electronic device located under, or at a lower portion of, the substrate, and a normal area located outside of the first optical area.

The first optical area may include a plurality of light emitting areas and a plurality of first transmission areas. The normal area may include a plurality of light emitting areas.

The plurality of signal lines may include a first signal line including a first optical signal line portion disposed in the first optical area and a non-optical signal line portion disposed in the normal area.

The first optical signal line portion of the first signal line may include a first portion not overlapping with a cathode electrode and a second portion overlapping with the cathode electrode.

A length per unit area of the first portion may be greater than a length per unit area of the second portion, or a width of the first portion may be smaller than a width of the second portion.

The first portion may be located closer to an outer edge of the first optical area than the second portion.

In an aspect of the present disclosure, a display panel and a display device can be provided that are capable of reducing a non-display area of the display panel and enabling an optical electronic device such as a camera, a sensor, and/or the like not to be exposed in the front surface of the display panel by disposing the optical electronic device under a display area, or at a lower portion, of the display panel.

In an aspect of the present disclosure, a display panel and a display device can be provided that have a light transmission structure for enabling an optical electronic device under the display area, or at a lower portion, of the display panel to normally receive light transmitting the display panel.

In an aspect of the present disclosure, a display panel and a display device can be provided that are capable of normally performing display driving in an optical area included in the display area of the display panel and overlapping with an optical electronic device.

In an aspect of the present disclosure, a display panel and a display device can be provided that have a structure for compensating for a difference in RC loads between a signal line disposed in an optical area and a signal line disposed in a normal area in a case where the display area of the display panel includes the optical area overlapping with an optical electronic device and the normal area not overlapping with the optical electronic device.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIG. 5A illustrates arrangements of signal lines in each of a first optical area and a normal area in the display panel according to aspects of the present disclosure;

FIGS. 6 and 7 are cross-sectional views of each of the first optical area, the second optical area, and the normal area included in the display area of the display panel according to aspects of the present disclosure;

DETAILED DESCRIPTION

Figure 1A:
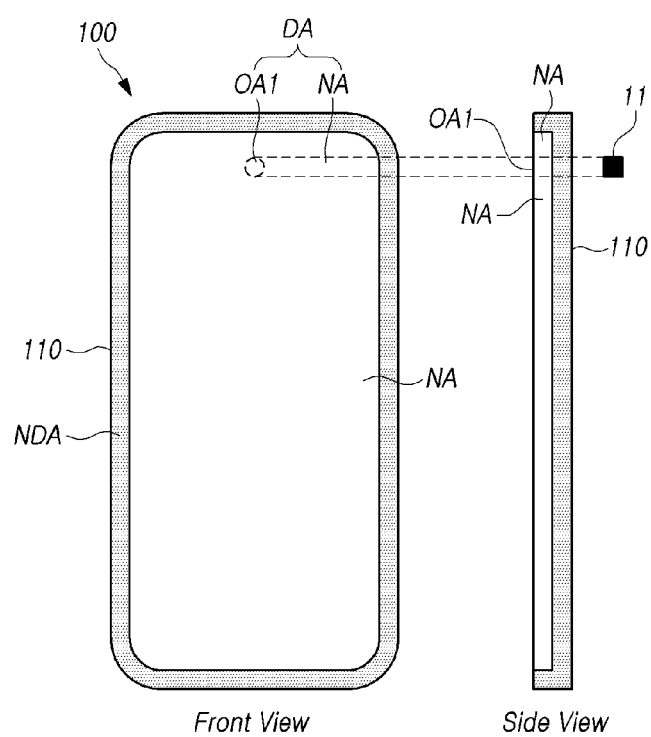
FIGS. 1A, 1B and 1C are plan views illustrating a display device according to aspects of the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, with reference to the accompanying drawings, various aspects of the present disclosure will be described in detail.

Figure 1B:
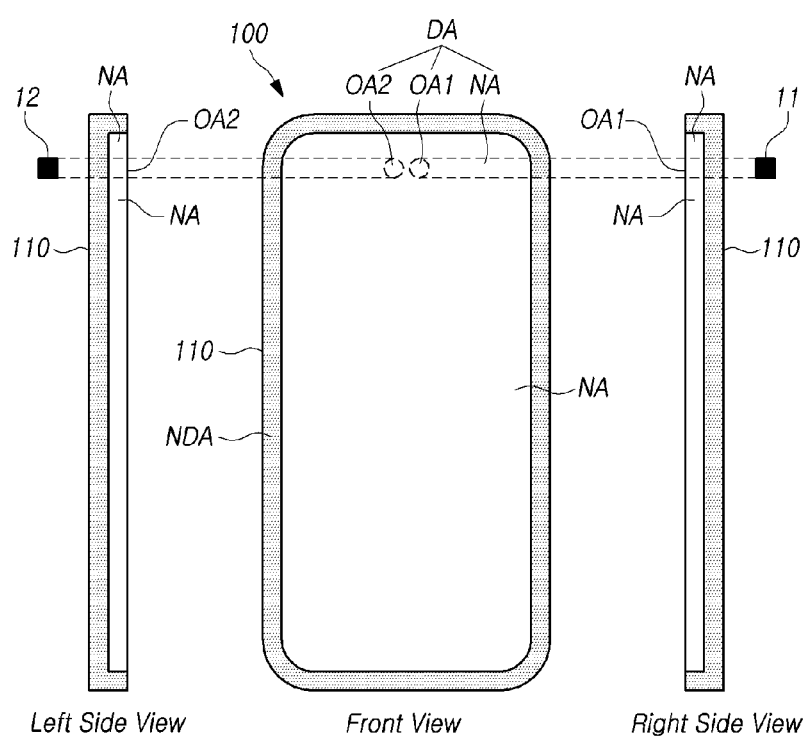
Figure 1C:
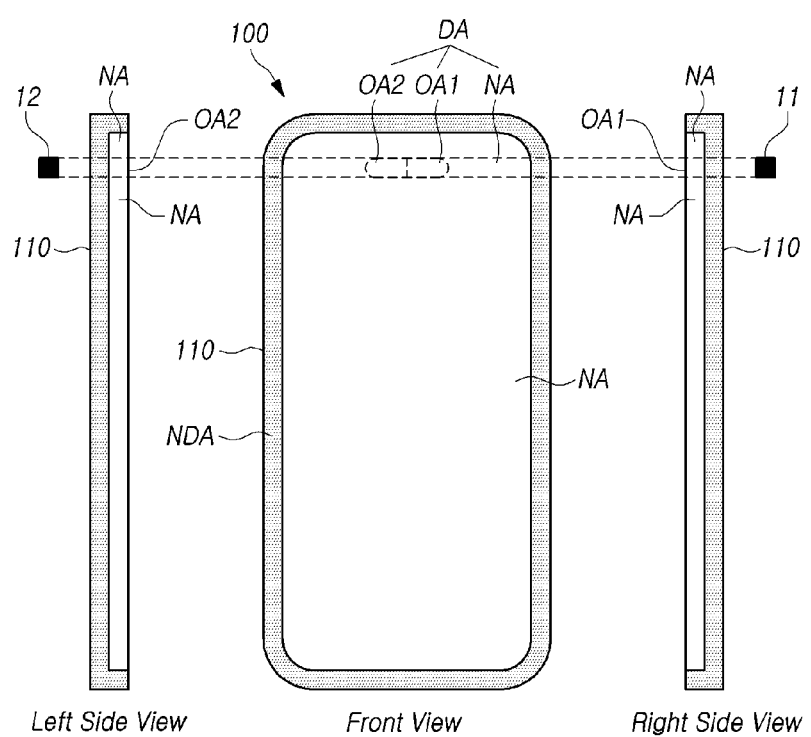

FIGS. 1A, 1B and 1C are plan views illustrating a display device 100 according to aspects of the present disclosure.

Referring to FIGS. 1A, 1*i*, and 1C, the display device 100 according to aspects of the present disclosure can include a display panel 110 for displaying images, and one or more optical electronic devices (11, 12).

The display panel 110 can include a display area DA in which an image is displayed and a non-display area NDA in which an image is not displayed.

A plurality of subpixels can be arranged in the display area DA, and several types of signal lines for driving the plurality of subpixels can be arranged therein.

The non-display area NDA may refer to an area outside of the display area DA. Several types of signal lines can be arranged in the non-display area NDA, and several types of driving circuits can be connected thereto. At least a portion of the non-display area NDA may be bent to be invisible from the front of the display panel or may be covered by a case (not shown) of the display panel 110 or the display device 100. The non-display area NDA may be also referred to as a bezel or a bezel area.

Referring to FIGS. 1A, 1B, and 1C, in the display device 100 according to aspects of the present disclosure, the one or more optical electronic devices (11, 12) may be located under, or in a lower portion of, the display panel 110 (an opposite side to the viewing surface thereof).

Light can enter the front surface (viewing surface) of the display panel 110, pass through the display panel 110, reach the one or more optical electronic devices (11, 12) located under, or in the lower portion of, the display panel 110 (the opposite side to the viewing surface).

The one or more optical electronic devices (11, 12) can receive or detect light transmitting through the display panel 110 and perform a predefined function based on the received light. For example, the one or more optical electronic devices (11, 12) may include one or more of an image capture device such as a camera (an image sensor), and/or the like, and a sensor such as a proximity sensor, an illuminance sensor, and/or the like.

Referring to FIGS. 1A, 1B, and 1C, in some aspects, the display area DA of the display panel 110 may include one or more optical areas (OA1, OA2) and a normal area NA.

Referring to FIGS. 1A, 1B, and 1C, the one or more optical areas (OA1, OA2) may be one or more areas overlapping with the one or more optical electronic devices (11, 12).

According to an example of FIG. 1A, the display area DA may include a first optical area OA1 and a normal area NA. In some aspects, at least a portion of the first optical area OA1 may overlap with a first optical electronic device 11. The normal area NA is an area that does not overlap with one or more optical electronic devices (11, 12) and may also be referred to as a non-optical area.

According to an example of FIG. 1B, the display area DA may include a first optical area OA1, a second optical area OA2, and a normal area NA. In the example of FIG. 1B, at least a portion of the normal area NA may be present between the first optical area OA1 and the second optical area OA2. In some aspects, at least a portion of the first optical area OA1 may overlap with the first optical electronic device 11, and at least a portion of the second optical area OA2 may overlap with a second optical electronic device 12.

According to an example of FIG. 1C, the display area DA may include a first optical area OA1, a second optical area OA2, and a normal area NA. In the example of FIG. 1C, the normal area NA may not be present between the first optical area OA1 and the second optical area OA2. For example, the first optical area OA1 and the second optical area OA2 may contact each other. In some aspects, at least a portion of the first optical area OA1 may overlap with the first optical electronic device 11, and at least a portion of the second optical area OA2 may overlap with the second optical electronic device 12.

Both an image display structure and alight transmission structure are needed to be formed in the one or more optical areas (OA1, OA2). In some aspects, since the one or more optical areas (OA1, OA2) are one or more portions of the display area DA, subpixels for displaying images are needed to be disposed in the one or more optical areas (OA1, OA2). Further, for enabling light to transmit the one or more optical electronic devices (11, 12), a light transmission structure is needed to be formed in the one or more optical areas (OA1, OA2).

According to the aspects described above, in spite of a fact that the one or more optical electronic devices (11, 12) are needed to receive or detect light, the one or more optical electronic devices (11, 12) is sometimes located on the back of the display panel 110 (under, or in the lower portion of, the display panel 110, i.e., the opposite side to the viewing surface), and thereby, can receive light that has transmitted the display panel 110.

For example, the one or more optical electronic devices (11, 12) may not be exposed in the front surface (viewing surface) of the display panel 110. Accordingly, when a user looks at the front of the display device 100, the one or more optical electronic devices (11, 12) are located to be invisible to the user.

In one aspect, the first optical electronic device 11 may be a camera, and the second optical electronic device 12 may be a sensor such as a proximity sensor, an illuminance sensor, and/or the like. For example, the sensor may be an infrared sensor capable of detecting infrared rays.

In another aspect, the first optical electronic device 11 may be a sensor, and the second optical electronic device 12 may be a camera.

Hereinafter, for convenience of description, discussions will be conducted on the aspect where the first optical electronic device 11 is a camera, and the second optical electronic device 12 is a sensor such as a proximity sensor, an illuminance sensor, an infrared sensor, and the like. For example, the camera may be a camera lens, an image sensor, or a unit including at least one of the camera lens and the image sensor.

In a case where the first optical electronic device 11 is the camera, this camera may be located on the back of (under, or in the lower portion of) the display panel 110, and be a front camera capable of capturing aspects in a front direction of the display panel 110. Accordingly, the user can capture an image through the camera that is not visible on the viewing surface while looking at the viewing surface of the display panel 110.

Although the normal area NA and the one or more optical areas (OA1, OA2) included in the display area DA in each of FIGS. 1A to 1C are areas where images can be displayed, the normal area NA is an area where a light transmission structure need not be formed, but the one or more optical areas (OA1, OA2) are areas where the light transmission structure need be formed.

Accordingly, the one or more optical areas (OA1, OA2) may have a transmittance greater than or equal to a predetermined level, i.e., a relatively high transmittance, and the normal area NA may not have light transmittance or have a transmittance less than the predetermined level i.e., a relatively low transmittance.

For example, the one or more optical areas (OA1, OA2) may have a resolution, a subpixel arrangement structure, the number of subpixels per unit area, an electrode structure, a line structure, an electrode arrangement structure, a line arrangement structure, or/and the like different from that/those of the normal area NA.

In one aspect, the number of subpixels per unit area in the one or more optical areas (OA1, OA2) may be smaller than the number of subpixels per unit area in the normal area NA. For example, the resolution of the one or more optical areas (OA1, OA2) may be lower than that of the normal area NA. Here, the number of sub-pixels per unit area may be a unit for measuring resolution, for example, referred to as pixels per inch (PPI), which represents the number of pixels within 1 inch.

In one aspect, in each of FIGS. 1A to 1C, the number of subpixels per unit area in the first optical areas OA1 may be smaller than the number of subpixels per unit area in the normal area NA. In one aspect, in each of FIGS. 1B and 1C, the number of subpixels per unit area in the second optical areas OA2 may be greater than or equal to the number of subpixels per unit area in the first optical areas OA1.

In each of FIGS. 1A to 1C, the first optical area OA1 may have various shapes, such as a circle, an ellipse, a quadrangle, a hexagon, an octagon or the like. In each of FIGS. 1B to 1C, the second optical area OA2 may have various shapes, such as a circle, an ellipse, a quadrangle, a hexagon, an octagon or the like. The first optical area OA1 and the second optical area OA2 may have the same shape or different shapes.

Referring to FIG. 1C, in a case where the first optical area OA1 and the second optical area OA2 contact each other, the entire optical area including the first optical area OA1 and the second optical area OA2 may also have various shapes, such as a circle, an ellipse, a quadrangle, a hexagon, an octagon or the like.

Hereinafter, for convenience of description, discussions will be conducted based on an aspect in which each of the first optical area OA1 and the second optical area OA2 has a circular shape.

Herein, in a case where the display device 100 according to aspects of the present disclosure has a structure in which the first optical electronic device 11 located to be covered under, or in the lower portion of, the display panel 110 without being exposed to the outside is a camera, the display device 100 may be referred to as a display (or display device) to which under-display camera (UDC) technology is applied.

The display device 100 according to this configuration can have an advantage of preventing the size of the display area DA from being reduced since a notch or a camera hole for exposing a camera need not be formed in the display panel 110.

Since the notch or the camera hole for camera exposure need not be formed in the display panel 110, the display device 100 can have further advantages of reducing the size of the bezel area, and improving the degree of freedom in design as such limitations to the design are removed.

Although the one or more optical electronic devices (11, 12) are located to be covered on the back of (under, or in the lower portion of) the display panel 110 in the display device 100 according to aspects of the present disclosure, that is, hidden not to be exposed to the outside, the one or more optical electronic devices (11, 12) are needed to be able to receive or detect light for normally performing predefined functionality.

Further, in the display device 100 according to aspects of the present disclosure, although the one or more optical electronic devices (11, 12) are located to be covered on the back of (under, or in the lower portion of) the display panel 110 and located to overlap with the display area DA, it is necessary for image display to be normally performed in the one or more optical areas (OA1, OA2) overlapping with the one or more optical electronic devices (11, 12) in the area DA.

Figure 2:
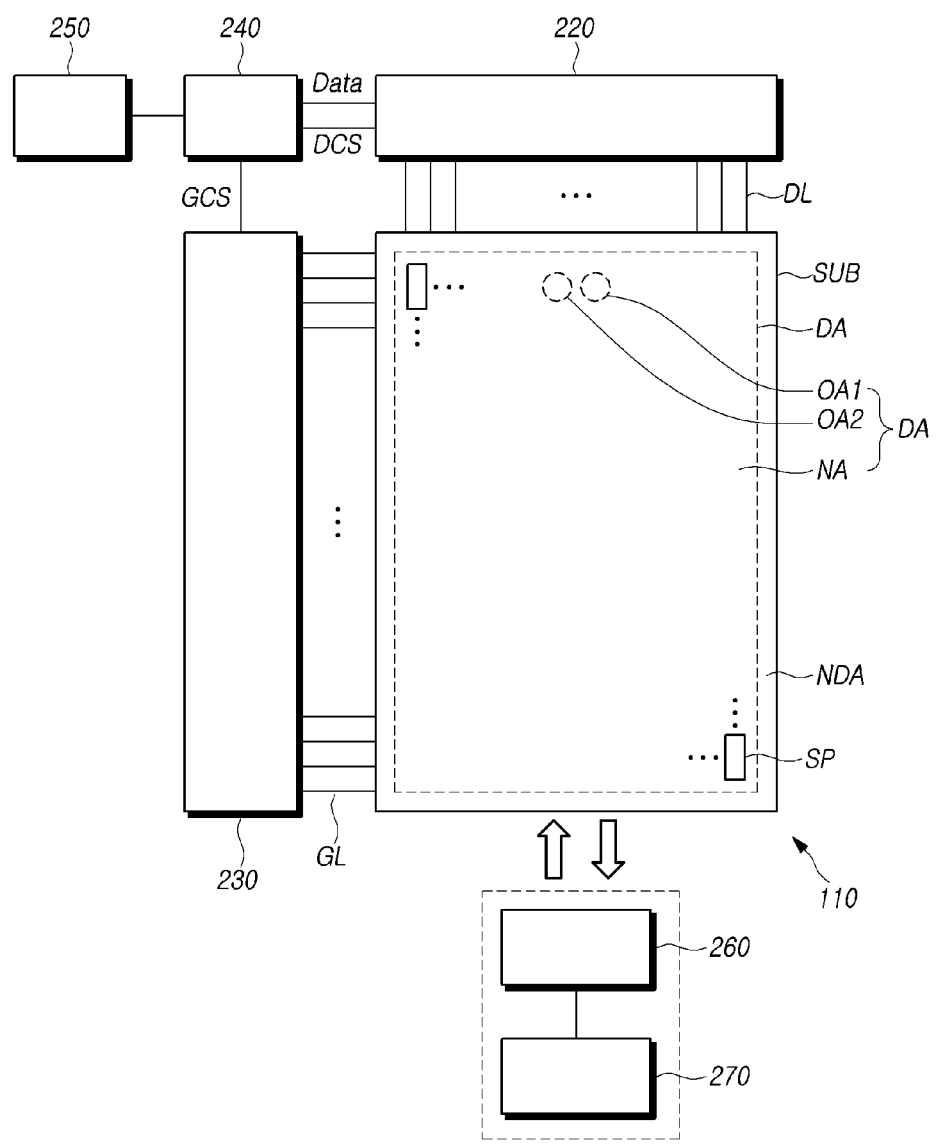
FIG. 2 illustrates a system configuration of the display device according to aspects of the present disclosure.

FIG. 2 illustrates a system configuration of a display device 100 according to aspects of the present disclosure.

Referring to FIG. 2, the display device 100 can include the display panel 110 and a display driving circuit as components for displaying an image.

The display driving circuit is a circuit for driving the display panel 110, and can include a data driving circuit 220, a gate driving circuit 230, a display controller 240, and the like.

The display panel 110 can include a display area DA in which an image is displayed and a non-display area NDA in which an image is not displayed. The non-display area NDA may be an area outside of the display area DA, and may also be referred to as an edge area or a bezel area. All or a portion of the non-display area NDA may be an area visible from the front surface of the display device 100, or an area that is bent and invisible from the front surface of the display device 100.

The display panel 110 can include a substrate SUB and a plurality of subpixels SP disposed on the substrate SUB. The display panel 110 can further include various types of signal lines to drive the plurality of subpixels SP.

In some aspects, the display device 100 herein may be a liquid crystal display device, or the like, or a self-emission display device in which light is emitted from the display panel 110 itself. In some aspects, when the display device 100 is the self-emission display device, each of the plurality of subpixels SP may include a light emitting element.

In some aspects, the display device 100 may be an organic light emitting display device in which the light emitting element is implemented using an organic light emitting diode (OLED). In some aspects, the display device 100 may be an inorganic light emitting display device in which the light emitting element is implemented using an inorganic material-based light emitting diode. In some aspects, the display device 100 may be a quantum dot display device in which the light emitting element is implemented using quantum dots, which are self-emission semiconductor crystals.

The structure of each of the plurality of subpixels SP may vary according to types of the display devices 100. For example, when the display device 100 is a self-emission display device including self-emission subpixels SP, each subpixel SP may include a self-emission light emitting element, one or more transistors, and one or more capacitors.

The various types of signal lines arranged in the display device 100 may include, for example, a plurality of data lines DL for carrying data signals (also referred to as data voltages or image signals), a plurality of gate lines GL for carrying gate signals (also referred to as scan signals), and the like.

The plurality of data lines DL and the plurality of gate lines GL may intersect each other. Each of the plurality of data lines DL may be disposed to extend in a first direction. Each of the plurality of gate lines GL may be disposed to extend in a second direction.

For example, the first direction may be a column or vertical direction, and the second direction may be a row or horizontal direction. In another example, the first direction may be the row direction, and the second direction may be the column direction.

The data driving circuit 220 is a circuit for driving the plurality of data lines DL, and can supply data signals to the plurality of data lines DL. The gate driving circuit 230 is a circuit for driving the plurality of gate lines GL, and can supply gate signals to the plurality of gate lines GL.

The display controller 240 is a device for controlling the data driving circuit 220 and the gate driving circuit 230, and can control driving timing for the plurality of data lines DL and driving timing for the plurality of gate lines GL.

The display controller 240 can supply a data driving control signal DCS to the data driving circuit 220 to control the data driving circuit 220, and supply a gate driving control signal GCS to the gate driving circuit 230 to control the gate driving circuit 230.

The display controller 240 can receive input image data from a host system 250 and supply image data Data to the data driving circuit 220 based on the input image data.

The data driving circuit 220 can supply data signals to the plurality of data lines DL according to the driving timing control of the display controller 240.

The data driving circuit 220 can receive the digital image data Data from the display controller 240, convert the received image data Data into analog data signals, and supply the resulting analog data signals to the plurality of data lines DL.

The gate driving circuit 230 can supply gate signals to the plurality of gate lines GL according to the timing control of the display controller 240. The gate driving circuit 230 can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In some aspects, the data driving circuit 220 may be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In some aspects, the gate driving circuit 230 may be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another aspect, the gate driving circuit 230 may be disposed in the non-display area NDA of the display panel 110 in a gate in panel (GIP) type. The gate driving circuit 230 may be disposed on or over the substrate, or connected to the substrate. That is, in the case of the GIP type, the gate driving circuit 230 may be disposed in the non-display area NDA of the substrate. The gate driving circuit 230 may be connected to the substrate in the case of the chip on glass (COG) type, the chip on film (COF) type, or the like.

At least one of the data driving circuit 220 and the gate driving circuit 230 may be disposed in the display area DA of the display panel 110. For example, at least one of the data driving circuit 220 and the gate driving circuit 230 may not overlap with subpixels SP, or may overlap with one or more, or all, of the subpixels SP.

The data driving circuit 220 may also be located on, but not limited to, only one side or portion (e.g., an upper edge or a lower edge) of the display panel 110. In some aspects, the data driving circuit 220 may be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 may be located on, but not limited to, only one side or portion (e.g., a left edge or a right edge) of the display panel 110. In some aspects, the gate driving circuit 230 may be located on, but not limited to, two sides or portions (e.g., a left edge and a right edge) of the panel 110 or at least two of four sides or portions (e.g., an upper edge, a lower edge, the left edge, and the right edge) of the panel 110 according to driving schemes, panel design schemes, or the like.

The display controller 240 may be implemented in a separate component from the data driving circuit 220, or integrated with the data driving circuit 220 and thus implemented in an integrated circuit.

The display controller 240 may be a timing controller used in the typical display technology or a controller or a control device capable of additionally performing other control functions in addition to the function of the typical timing controller. In some aspects, the display controller 240 may be a controller or a control device different from the timing controller, or a circuitry or a component included in the controller or the control device. The display controller 240 may be implemented with various circuits or electronic components such as an integrated circuit (IC), a field programmable gate array (FPGA), an application specific integrated circuit (ASIC), a processor, and/or the like.

The display controller 240 may be mounted on a printed circuit board, a flexible printed circuit, and/or the like and be electrically connected to the gate driving circuit 230 and the data driving circuit 220 through the printed circuit board, flexible printed circuit, and/or the like.

The display controller 240 may transmit signals to, and receive signals from, the data driving circuit 220 via one or more predefined interfaces. In some aspects, such interfaces may include a low voltage differential signaling (LVDS) interface, an EPI interface, a serial peripheral interface (SP), and the like.

In some aspects, in order to further provide a touch sensing function, as well as an image display function, the display device 100 may include at least one touch sensor, and a touch sensing circuit capable of detecting whether a touch event occurs by a touch aspect such as a finger, a pen, or the like, or of detecting a corresponding touch position, by sensing the touch sensor.

The touch sensing circuit can include a touch driving circuit 260 capable of generating and providing touch sensing data by driving and sensing the touch sensor, a touch controller 270 capable of detecting the occurrence of a touch event or detecting a touch position using the touch sensing data, and the like.

The touch sensor can include a plurality of touch electrodes. The touch sensor can further include a plurality of touch lines for electrically connecting the plurality of touch electrodes to the touch driving circuit 260.

The touch sensor may be implemented in a touch panel, or in the form of a touch panel, outside of the display panel 110, or be implemented inside of the display panel 110. When the touch sensor is implemented in the touch panel, or in the form of the touch panel, outside of the display panel 110, such a touch sensor is referred to as an add-on type. When the add-on type of touch sensor is disposed, the touch panel and the display panel 110 may be separately manufactured and combined during an assembly process. The add-on type of touch panel may include a touch panel substrate and a plurality of touch electrodes on the touch panel substrate.

When the touch sensor is implemented inside of the display panel 110, the touch sensor may be disposed over the substrate SUB together with signal lines and electrodes related to display driving during the process of manufacturing the display panel 110.

The touch driving circuit 260 can supply a touch driving signal to at least one of the plurality of touch electrodes, and sense at least one of the plurality of touch electrodes to generate touch sensing data.

The touch sensing circuit can perform touch sensing using a self-capacitance sensing method or a mutual-capacitance sensing method.

When the touch sensing circuit performs touch sensing in the self-capacitance sensing method, the touch sensing circuit can perform touch sensing based on capacitance between each touch electrode and a touch aspect (e.g., a finger, a pen, etc.).

According to the self-capacitance sensing method, each of the plurality of touch electrodes can serve as both a driving touch electrode and a sensing touch electrode. The touch driving circuit 260 can drive all, or one or more, of the plurality of touch electrodes and sense al, or one or more, of the plurality of touch electrodes.

When the touch sensing circuit performs touch sensing in the mutual-capacitance sensing method, the touch sensing circuit can perform touch sensing based on capacitance between touch electrodes.

According to the mutual-capacitance sensing method, the plurality of touch electrodes are divided into driving touch electrodes and sensing touch electrodes. The touch driving circuit 260 can drive the driving touch electrodes and sense the sensing touch electrodes.

The touch driving circuit 260 and the touch controller 270 included in the touch sensing circuit may be implemented in separate devices or in a single device. Further, the touch driving circuit 260 and the data driving circuit 220 may be implemented in separate devices or in a single device.

The display device 100 may further include a power supply circuit for supplying various types of power to the display driving circuit and/or the touch sensing circuit.

In some aspects, the display device 100 may be a mobile terminal such as a smart phone, a tablet, or the like, or a monitor, a television (TV), or the like. Such devices may be of various types, sizes, and shapes. The display device 100 according to aspects of the present disclosure are not limited thereto, and includes displays of various types, sizes, and shapes for displaying information or images.

As described above, the display area DA of the display panel 110 may include a normal area NA and one or more optical areas (OA1, OA2), for example, as shown in FIGS. 1A to 1C.

The normal area NA and the one or more optical areas (OA1, OA2) are areas where an image can be displayed. However, the normal area NA is an area in which a light transmission structure need not be implemented, and the one or more optical areas OA1, OA2 are areas in which the light transmission structure need be implemented.

As discussed above with respect to the examples of FIGS. 1A to 1C, although the display area DA of the display panel 110 may include the one or more optical areas (OA1, OA2) in addition to the normal area NA, for convenience of description, in the discussion that follows, it is assumed that the display area DA includes first and second optical areas (OA1, OA2) and the normal area NA; and the normal area NA thereof includes the normal areas NAs in FIGS. 1A to 1C, and the first and second optical areas (OA1, OA2) thereof include the first optical areas OA1s in FIGS. 1A to 1C and the second optical areas OA2s of FIGS. 1B and 1C, respectively, unless explicitly stated otherwise.

Figure 3:
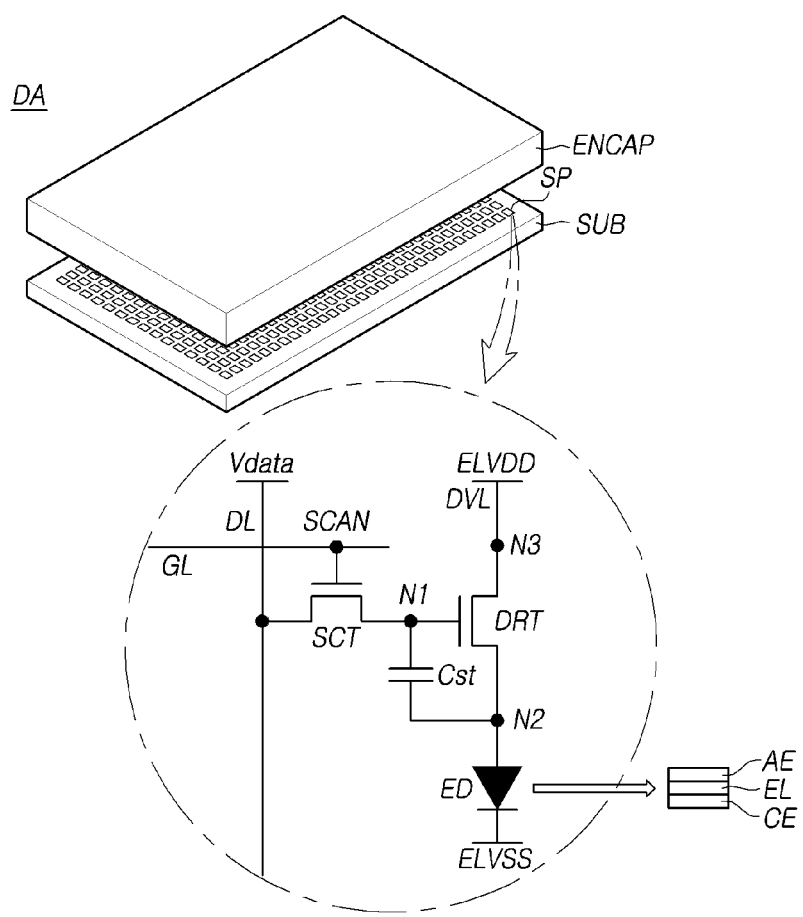
FIG. 3 illustrates an equivalent circuit of a subpixel in a display panel according to aspects of the present disclosure.

FIG. 3 illustrates an equivalent circuit of a subpixel SP in the display panel 110 according to aspects of the present disclosure.

Each of subpixels SP disposed in the normal area NA, the first optical area OA1, and the second optical area OA2 included in the display area DA of the display panel 110 may include a light emitting element ED, a driving transistor DRT for driving the light emitting element ED, a scan transistor SCT for transmitting a data voltage VDATA to a first node N1 of the driving transistor DRT, a storage capacitor Cst for maintaining a voltage at an approximate constant level during one frame, and the like.

The driving transistor DRT can include the first node N1 to which a data voltage is applied, a second node N2 electrically connected to the light emitting element ED, and a third node N3 to which a driving voltage ELVDD through a driving voltage line DVL is applied. In the driving transistor DRT, the first node N1 may be a gate node, the second node N2 may be a source node or a drain node, and the third node N3 may be the drain node or the source node.

The light emitting element ED can include an anode electrode AE, an emission layer EL, and a cathode electrode CE. The anode electrode AE may be a pixel electrode disposed in each subpixel SP, and may be electrically connected to the second node N2 of the driving transistor DRT of each subpixel SP. The cathode electrode CE may be a common electrode commonly disposed in the plurality of subpixels SP, and a base voltage ELVSS such as a low-level voltage may be applied to the cathode electrode CE.

For example, the anode electrode AE may be the pixel electrode, and the cathode electrode CE may be the common electrode. In another example, the anode electrode AE may be the common electrode, and the cathode electrode CE may be the pixel electrode. For convenience of description, in the discussion that follows, it is assumed that the anode electrode AE is the pixel electrode, and the cathode electrode CE is the common electrode unless explicitly stated otherwise.

The light emitting element ED may be, for example, an organic light emitting diode (OLED), an inorganic light emitting diode, a quantum dot light emitting element, or the like. In a case where an organic light emitting diode is used as the light emitting element ED, the emission layer EL included in the light emitting element ED may include an organic emission layer including an organic material.

The scan transistor SCT may be turned on and off by a scan signal SCAN that is a gate signal applied through a gate line GL, and be electrically connected between the first node N1 of the driving transistor DRT and a data line DL.

The storage capacitor Cst may be electrically connected between the first node N1 and the second node N2 of the driving transistor DRT.

Each subpixel SP may include two transistors (2T: DRT and SCT) and one capacitor (1C: Cst) (referred to as "2T1C structure") as shown in FIG. 3, and in some cases, may further include one or more transistors, or further include one or more capacitors.

The storage capacitor Cst may be an external capacitor intentionally designed to be located outside of the driving transistor DRT, other than an internal capacitor, such as a parasitic capacitor (e.g., Cgs and Cgd), that may be present between the first node N1 and the second node N2 of the driving transistor DRT.

Each of the driving transistor DRT and the scan transistor SCT may be an n-type transistor or a p-type transistor.

Since circuit elements (in particular, a light emitting element ED) in each subpixel SP are vulnerable to external moisture or oxygen, an encapsulation layer ENCAP may be disposed in the display panel 110 in order to prevent the external moisture or oxygen from penetrating into the circuit elements (in particular, the light emitting element ED). The encapsulation layer ENCAP may be disposed to cover the light emitting element ED.

Figure 4:
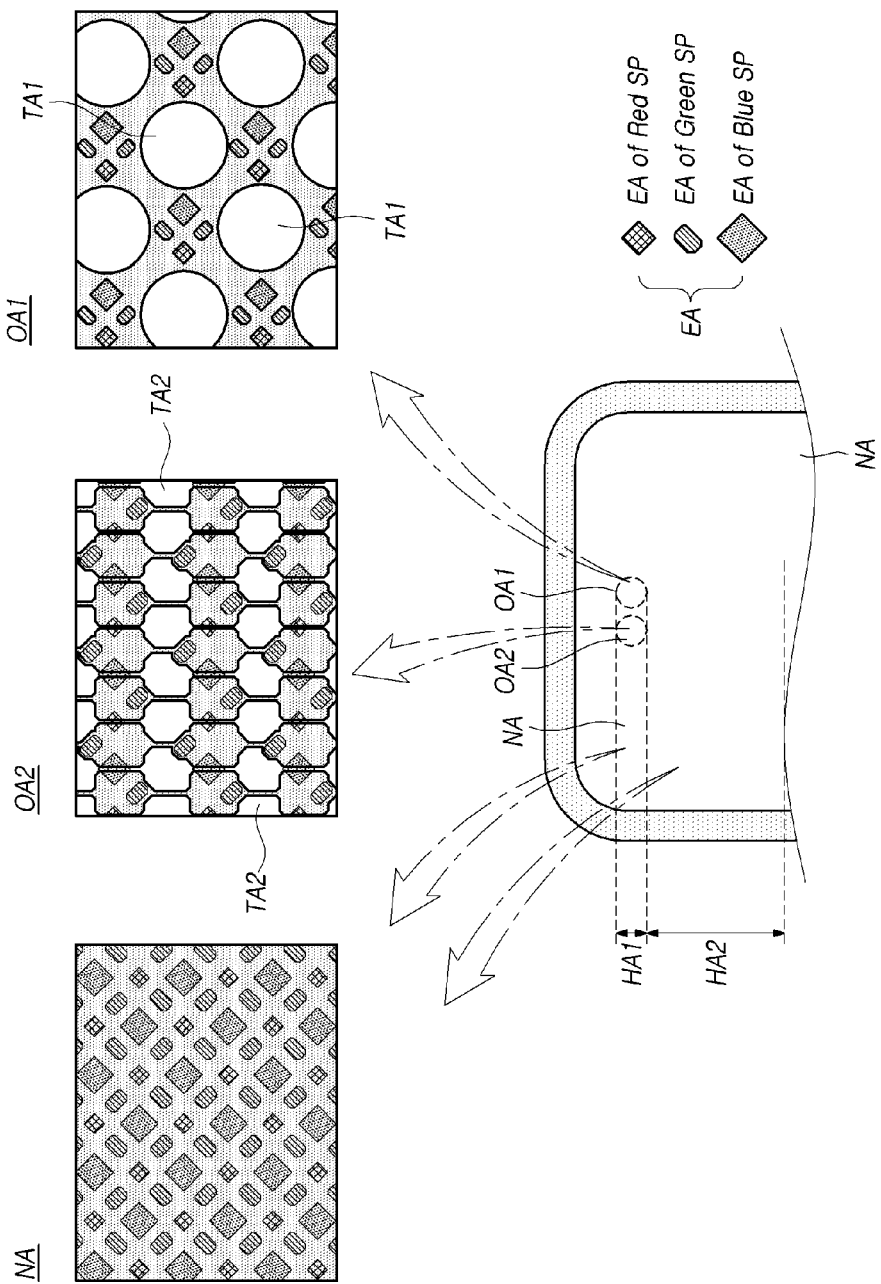
FIG. 4 illustrates arrangements of subpixels in three areas included in the display area of the display panel according to aspects of the present disclosure.

FIG. 4 illustrates arrangements of subpixels SP in the three areas (NA, OA1, and OA2) included in the display area DA of the display panel 110 according to aspects of the present disclosure.

Referring to FIG. 4, a plurality of subpixels SP may be disposed in each of the normal area NA, the first optical area OA1, and the second optical area OA2 included in the display area DA.

The plurality of subpixels SP may include, for example, a red subpixel (Red SP) emitting red light, a green subpixel (Green SP) emitting green light, and a blue subpixel (Blue SP) emitting blue light.

Accordingly, each of the normal area NA, the first optical area OA1, and the second optical area OA2 may include one or more light emitting areas EA of one or more red subpixels (Red SP), and one or more light emitting areas EA of one or more green subpixels (Green SP), and one or more light emitting areas EA of one or more blue subpixels (Blue SP).

Referring to FIG. 4, the normal area NA may not include a light transmission structure, but may include light emitting areas EA.

However, the first optical area OA1 and the second optical area OA2 need to include both the light emitting areas EA and the light transmission structure.

Accordingly, the first optical area OA1 can include light emitting areas EA and first transmission areas TA1 (also called transmissive area), and the second optical area OA2 can include the light emitting areas EA and second transmission area TA2.

The light emitting areas EA and the transmission areas (TA1, TA2) may be distinct according to whether the transmission of light is allowed. That is, the light emitting areas EA may be areas not allowing light to transmit, and the transmission areas TA1, TA2 may be area allowing light to transmit.

The light emitting areas EA and the transmission areas TA1, TA2 may be also distinct according to whether or not a specific metal layer CE is included. For example, the cathode electrode CE may be disposed in the light emitting areas EA, and the cathode electrode CE may not be disposed in the transmission areas (TA1, TA2). Further, a light shield layer may be disposed in the light emitting areas EA, and a light shield layer may not be disposed in the transmission areas (TA1, TA2).

Since the first optical area OA1 includes the first transmission areas TA1 and the second optical area OA2 includes the second transmission areas TA2, both of the first optical area OA1 and the second optical area OA2 are areas through which light can pass.

In one aspect, a transmittance (a degree of transmission) of the first optical area OA1 and a transmittance (a degree of transmission) of the second optical area OA2 may be substantially equal.

For example, the first transmission area TA1 of the first optical area OA1 and the second transmission area TA2 of the second optical area OA2 may have a substantially equal shape or size. In another example, even when the first transmission area TA1 of the first optical area OA1 and the second transmission area TA2 of the second optical area OA2 have different shapes or sizes, a ratio of the first transmission area TA1 to the first optical area OA1 and a ratio of the second transmission area TA2 to the second optical area OA2 may be substantially equal.

In another aspect, a transmittance (a degree of transmission) of the first optical area OA1 and a transmittance (a degree of transmission) of the second optical area OA2 may be different.

For example, the first transmission area TA1 of the first optical area OA1 and the second transmission area TA2 of the second optical area OA2 may have different shapes or sizes. In another example, even when the first transmission area TA1 of the first optical area OA1 and the second transmission area TA2 of the second optical area OA2 have a substantially equal shape or size, a ratio of the first transmission area TA1 to the first optical area OA1 and a ratio of the second transmission area TA2 to the second optical area OA2 may be different from each other.

For example, in a case where the first optical electronic device 11 overlapping with the first optical area OA1 is a camera, and the second optical electronic device 12 overlapping with the second optical area OA2 is a sensor for detecting images, the camera may need a greater amount of light than the sensor.

Thus, the transmittance (degree of transmission) of the first optical area OA1 may be greater than the transmittance (degree of transmission) of the second optical area OA2.

In this case, the first transmission area TA1 of the first optical area OA1 may have a size greater than the second transmission area TA2 of the second optical area OA2. In another example, even when the first transmission area TA1 of the first optical area OA1 and the second transmission area TA2 of the second optical area OA2 have a substantially equal size, a ratio of the first transmission area TA1 to the first optical area OA1 may be greater than a ratio of the second transmission area TA2 to the second optical area OA2.

For convenience of description, the discussion that follows is performed based on the aspect in which the transmittance (degree of transmission) of the first optical area OA1 is greater than the transmittance (degree of transmission) of the second optical area OA2.

Further, the transmission areas (TA1, TA2) as shown in FIG. 4 may be referred to as transparent areas, and the term transmittance may be referred to as transparency.

Further, in the discussion that follows, it is assumed that the first optical areas OA1 and the second optical areas OA2 are located in an upper edge of the display area DA of the display panel 110, and are disposed to be horizontally adjacent to each other such as being disposed in a direction in which the upper edge extends, as shown in FIG. 4, unless explicitly stated otherwise.

Referring to FIG. 4, a horizontal display area in which the first optical area OA1 and the second optical area OA2 are disposed is referred to as a first horizontal display area HA1, and another horizontal display area in which the first optical area OA1 and the second optical area OA2 are not disposed is referred to as a second horizontal display area HA2.

Referring to FIG. 4, the first horizontal display area HA1 may include a portion of the normal area NA, the first optical area OA1, and the second optical area OA2. The second horizontal display area HA2 may include only another portion of the normal area NA.

Meanwhile, the pixel density differentiation design scheme as described above may be applied as a method for increasing a transmittance of at least one of the first optical area OA1 and the second optical area OA2. According to the pixel density differentiation design scheme, in one aspect, the display panel 110 may be designed such that the number of subpixels per unit area of at least one of the first optical area OA1 and the second optical area OA2 is greater than the number of subpixels per unit area of the normal area NA.

According to a requirement, in another aspect, the pixel size differentiation design scheme may be applied as another method for increasing a transmittance of at least one of the first optical area OA1 and the second optical area OA2. According to the pixel size differentiation design scheme, the display panel 110 may be designed such that the number of subpixels per unit area of at least one of the first optical area OA1 and the second optical area OA2 is equal to or similar to the number of subpixels per unit area of the normal area NA; however, a size of each subpixel SP (i.e., a size of a corresponding light emitting area) disposed in at least one of the first optical area OA1 and the second optical area OA2 is smaller than a size of each subpixel SP (i.e., a size of a corresponding light emitting area) disposed in the normal area NA.

For convenience of description, the discussion that follows is performed based on the pixel density differentiation design scheme of the two schemes (the pixel density differentiation design scheme and the pixel size differentiation design scheme) for increasing the transmittance of at least one of the first optical area OA1 and the second optical area OA2, unless explicitly stated otherwise.

Subpixels SP included in the first optical area OA1 may be disposed to be distributed over the whole (an edge area and an inner area thereof) of the first optical area OA1 as shown in FIG. 4, or be disposed only in the edge area of the first optical area OA1.

Likewise, subpixels SP included in the second optical area OA2 may be disposed to be distributed over the whole (an edge area and an inner area thereof) of the second optical area OA2 as shown in FIG. 4, or be disposed only in the edge area of the second optical area OA2.

Figure 5B:
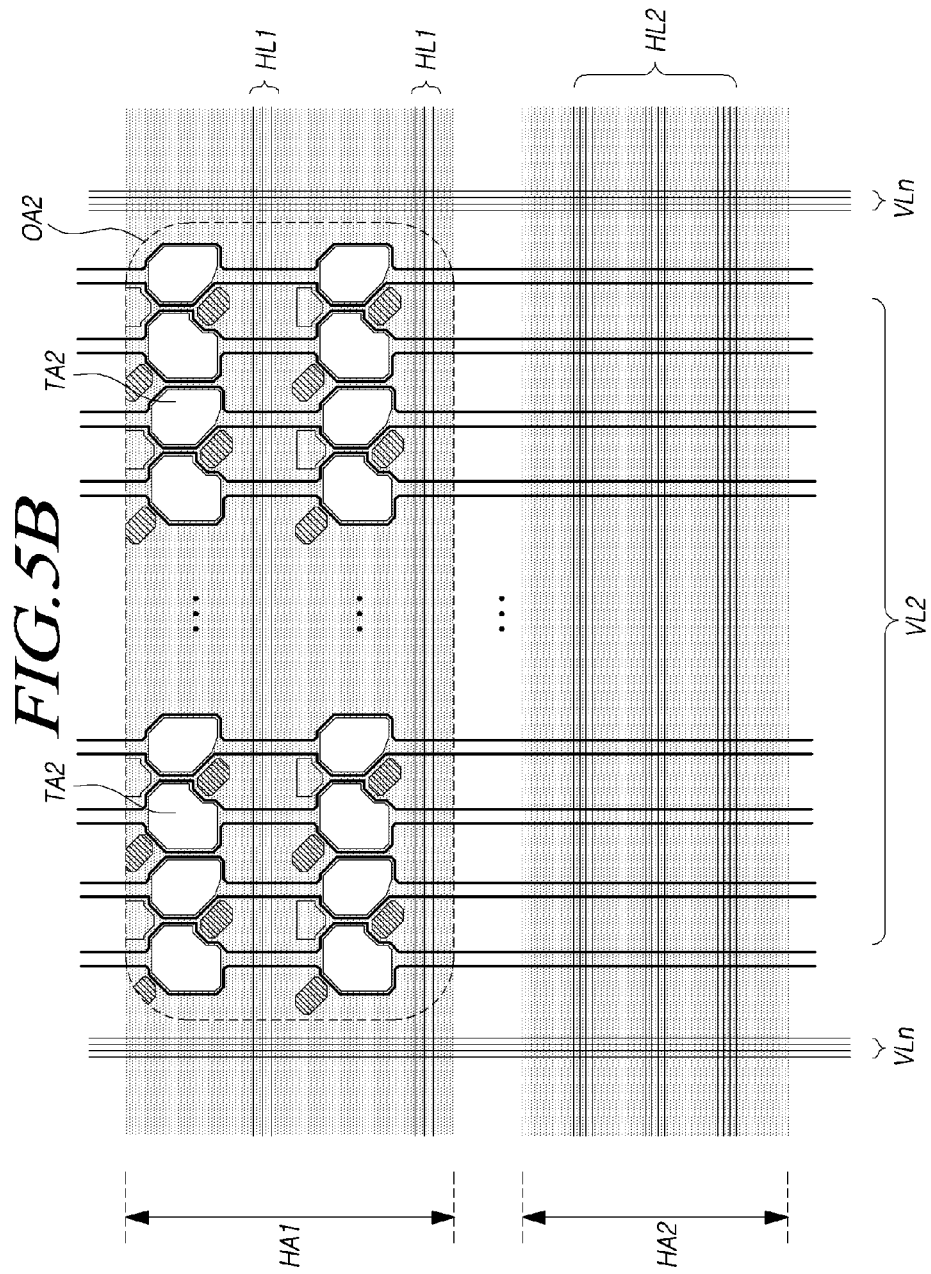
FIG. 5B illustrates arrangements of signal lines in each of a second optical area and the normal area in the display panel according to aspects of the present disclosure.

FIG. 5A illustrates arrangements of signal lines in each of the first optical area OA1 and the normal area NA of the display panel 110 according to aspects of the present disclosure, and FIG. 5B illustrates arrangements of signal lines in each of the second optical area OA2 and the normal area NA of the display panel 110 according to aspects of the present disclosure.

First horizontal display areas HA1 shown in FIGS. 5A and 5B are portions of the first horizontal display area HA1 of the display panel 110, and second horizontal display areas HA2 therein are portions of the second horizontal display area HA2 of the display panel 110.

A first optical area OA1 shown in FIG. 5A is a portion of the first optical area OA1 of the display panel 110, and a second optical area OA2 shown in FIG. 5B is a portion of the second optical area OA2 of the display panel 110.

Referring to FIGS. 5A and 5B, the first horizontal display area HA1 may include a portion of the normal area NA, the first optical area OA1, and the second optical area OA2. The second horizontal display area HA2 may include another portion of the normal area NA.

Various types of horizontal lines HL1, HL2 and various types of vertical lines VLn, VL1, VL2 may be disposed in the display panel 110.

Herein, the term "horizontal" and the term "vertical" are used to refer to two directions intersecting the display panel; however, it should be noted that the horizontal direction and the vertical direction may be changed depending on a viewing direction. The horizontal direction may refer to, for example, a direction in which one gate line GL is disposed to extend and, and the vertical direction may refer to, for example, a direction in which one data line DL is disposed to extend. As such, the term horizontal and the term vertical are used to represent two directions.

Referring to FIGS. 5A and 5B, the horizontal lines disposed in the display panel 110 may include first horizontal lines HL1 disposed in the first horizontal display area HA1 and second horizontal lines HL2 disposed on the second horizontal display area HA2.

The horizontal lines disposed in the display panel 110 may be gate lines GL. That is, the first horizontal lines HL1 and the second horizontal lines HL2 may be the gate lines GL. The gate lines GL may include various types of gate lines according to structures of one or more subpixels SP.

Referring to FIGS. 5A and 5B, the vertical lines disposed in the display panel 110 may include typical vertical lines VLn disposed only in the normal area NA, first vertical lines VL1 running through both of the first optical area OA1 and the normal area NA, second vertical lines VL2 running through both of the second optical area OA2 and the normal area NA.

The vertical lines disposed in the display panel 110 may include data lines DL, driving voltage lines DVL, and the like, and may further include reference voltage lines, initialization voltage lines, and the like. That is, the typical vertical lines VLn, the first vertical lines VL1 and the second vertical lines VL2 may include the data lines DL, the driving voltage lines DVL, and the like, and may further include the reference voltage lines, the initialization voltage lines, and the like.

In some aspects, it should be noted that the term "horizontal" in the second horizontal line HL2 may mean only that a signal is carried from a left side, to a right side, of the display panel (or from the right side to the left side), and may not mean that the second horizontal line HL2 runs in a straight line only in the direct horizontal direction. For example, in FIGS. 5A and 5B, although the second horizontal lines HL2 are illustrated in a straight line, however, one or more of the second horizontal lines HL2 may include one or more bent or folded portions differently from the configurations thereof. Likewise, one or more of the first horizontal lines HL1 may also include one or more bent or folded portions.

In some aspects, it should be noted that the term "vertical" in the typical vertical line VLn may mean only that a signal is carried from an upper portion, to a lower portion, of the display panel (or from the lower portion to the upper portion), and may not mean that the typical vertical line VLn runs in a straight line only in the direct vertical direction. For example, in FIGS. 5A and 5B, although the typical vertical lines VLn are illustrated in a straight line, however, one or more of the typical vertical lines VLn may include one or more bent or folded portions differently from the configurations thereof. Likewise, one or more of the first vertical line VL1 and one or more of the second vertical line VL2 may also include one or more bent or folded portions.

Referring to FIG. 5A, the first optical area OA1 included in the first horizontal area HA1 may include light emitting areas EA and first transmission areas TAL. In the first optical area OA1, respective outer areas of the first transmission areas TA1 may include corresponding light emitting areas EA.

Referring to FIG. 5A, in order to improve the transmittance of the first optical area OA1, the first horizontal lines HL1 may run through the first optical area OA1 by avoiding the first transmission areas TA1 in the first optical area OA1.

Accordingly, each of the first horizontal lines HL1 running through the first optical area OA1 may include one or more curved or bent portions running around one or more respective outer edges of one or more of the first transmission areas TA1.

Accordingly, the first horizontal lines HL1 disposed in the first horizontal area HA1 and the second horizontal lines HL2 disposed in the second horizontal area HA2 may have different shapes or lengths. For example, the first horizontal lines HL1 running through the first optical area OA1 and the second horizontal lines HL2 not running through the first optical area OA1 may have different shapes or lengths.

Further, in order to improve the transmittance of the first optical area OA1, the first vertical lines VL1 may run through the first optical area OA1 by avoiding the first transmission areas TA1 in the first optical area OA1.

Accordingly, each of the first vertical lines VL1 running through the first optical area OA1 may include one or more curved or bent portions running around one or more respective outer edges of one or more of the first transmission areas TAL.

Thus, the first vertical lines VL1 running through the first optical area OA1 and the typical vertical lines VLn disposed in the normal area NA without running through the first optical area OA1 may have different shapes or lengths.

Referring to FIG. 5A, the first transmission areas TA1 included in the first optical area OA1 in the first horizontal area HA1 may be arranged in a diagonal direction.

Referring to FIG. 5A, in the first optical area OA1 in the first horizontal area HA1, one or more light emitting areas EA may be disposed between two horizontally adjacent first transmission areas TAL. In the first optical area OA1 in the first horizontal area HA1, one or more light emitting areas EA may be disposed between two vertically adjacent first transmission areas TA1.

Referring to FIG. 5A, the first horizontal lines HL1 disposed in the first horizontal area HA1, that is, the first horizontal lines HL1 running through the first optical area OA1 each may include one or more curved or bent portions running around one or more respective outer edges of one or more of the first transmission areas TAL.

Referring to FIG. 5B, the second optical area OA2 included in the first horizontal area HA1 may include light emitting areas EA and second transmission areas TA2. In the second optical area OA2, respective outer areas of the second transmission areas TA2 may include corresponding light emitting areas EA.

In one aspect, the light emitting areas EA and the second transmission areas TA2 in the second optical area OA2 may have locations and arrangements substantially equal to the light emitting areas EA and the first transmission areas TA1 in the first optical area OA1 of FIG. 5A.

In another aspect, as shown in FIG. 5B, the light emitting areas EA and the second transmission areas TA2 in the second optical area OA2 may have locations and arrangements different from the light emitting areas EA and the first transmission areas TA1 in the first optical area OA1 of FIG. 5A.

For example, referring to FIG. 5B, the second transmission areas TA2 in the second optical area OA2 may be arranged in the horizontal direction (the left to right or right to left direction). A light emitting area EA may not be disposed between two second transmission areas TA2 adjacent to each other in the horizontal direction. Further, one or more of the light emitting areas EA in the second optical area OA2 may be disposed between second transmission areas TA2 adjacent to each other in the vertical direction (the top to bottom or bottom to top direction). For example, one or more light emitting areas EA may be disposed between two rows of second transmission areas.

When in the first horizontal area HA1, running through the second optical area OA2 and the normal area NA adjacent to the second optical area OA2, in one aspect, the first horizontal lines HL1 may have substantially the same arrangement as the first horizontal lines HL1 of FIG. 5A.

In another aspect, as shown in FIG. 5B, when in the first horizontal area HA1, running through the second optical area OA2 and the normal area NA adjacent to the second optical area OA2, the first horizontal lines HL1 may have an arrangement different from the first horizontal lines HL1 of FIG. 5A.

This is because that the light emitting areas EA and the second transmission areas TA2 in the second optical area OA2 of FIG. 5B have locations and arrangements different from the light emitting areas EA and the first transmission areas TA1 in the first optical area OA1 of FIG. 5A.

Referring to FIG. 5B, when in the first horizontal area HA1, the first horizontal lines HL1 run through the second optical area OA2 and the normal area NA adjacent to the second optical area OA2, the first horizontal lines HL1 may run between vertically adjacent second transmission areas TA2 in a straight line without having a curved or bent portion.

For example, one first horizontal line HL1 may have one or more curved or bent portions in the first optical area OA1, but may not have a curved or bent portion in the second optical area OA2.

In order to improve the transmittance of the second optical area OA2, the second vertical lines VL2 may run through the second optical area OA2 by avoiding the second transmission areas TA2 in the second optical area OA2.

Accordingly, each of the second vertical lines VL2 running through the second optical area OA2 may include one or more curved or bent portions running around one or more respective outer edges of one or more of the second transmission areas TA2.

Thus, the second vertical lines VL2 running through the second optical area OA2 and the typical vertical lines VLn disposed in the normal area NA without running through the second optical area OA2 may have different shapes or lengths.

As shown in FIG. 5A, each, or one or more, of the first horizontal lines HL1 running through the first optical area OA1 may have one or more curved or bent portions running around one or more respective outer edges of one or more of the first transmission areas TAL.

Accordingly, a length of the first horizontal line HL1 running through the first optical area OA1 and the second optical area OA2 may be slightly longer than a length of the second horizontal line HL2 disposed only in the normal area NA without running through the first optical area OA1 and the second optical area OA2 and.

Accordingly, a resistance of the first horizontal line HL1 running through the first optical area OA1 and the second optical area OA2, which is referred to as a first resistance, may be slightly greater than a resistance of the second horizontal line HL2 disposed only in the normal area NA without running through the first optical area OA1 and the second optical area OA2 and, which is referred to as a second resistance.

Referring to FIGS. 5A and 5B, according to a light transmitting structure, since the first optical area OA1 that at least partially overlaps with the first optical electronic device 11 includes the first transmitting areas TA1, and the second optical area OA2 that at least partially overlaps with the second optical electronic device 12 includes the second transmission areas TA2, therefore, the first optical area OA1 and the second optical area OA2 may have the number of subpixels per unit area smaller than the normal area NA.

Accordingly, the number of subpixels connected to each, or one or more, of the first horizontal lines HL1 running through the first optical area OA1 and the second optical area OA2 may be different from the number of subpixels connected to each, or one or more, of the second horizontal lines HL2 disposed only in the normal area NA without running through the first optical area OA1 and the second optical area OA2.

The number of subpixels connected to each, or one or more, of the first horizontal lines HL1 running through the first optical area OA1 and the second optical area OA2, which is referred to as a first number, may be smaller than the number of subpixels connected to each, or one or more, of the second horizontal lines HL2 disposed only in the normal area NA without running through the first optical area OA1 and the second optical area OA2, which is referred to as a second number.

A difference between the first number and the second number may vary according to a difference between a resolution of each of the first optical area OA1 and the second optical area OA2 and a resolution of the normal area NA. For example, as a difference between a resolution of each of the first optical area OA1 and the second optical area OA2 and a resolution of the normal area NA increases, a difference between the first number and the second number may increase.

As described above, since the number (the first number) of subpixels connected to each, or one or more, of the first horizontal lines HL1 running through the first optical area OA1 and the second optical area OA2 is smaller than the number of subpixels (second number) connected to each, or one or more, of the second horizontal lines HL2 disposed only in the normal area NA without running through the first optical area OA1 and the second optical area OA2, an area where the first horizontal line HL1 overlaps with one or more other electrodes or lines adjacent to the first horizontal line HL1 may be smaller than an area where the second horizontal line HL2 overlaps with one or more other electrodes or lines adjacent to the second horizontal line HL2.

Accordingly, a parasitic capacitance formed between the first horizontal line HL1 and one or more other electrodes or lines adjacent to the first horizontal line HL1, which is referred to as a first capacitance, may be greatly smaller than a parasitic capacitance formed between the second horizontal line HL2 and one or more other electrodes or lines adjacent to the second horizontal line HL2, which is referred to as a second capacitance.

Considering a relationship in magnitude between the first resistance and the second resistance (the first resistance≈second resistance) and a relationship in magnitude between the first capacitance and the second capacitance (the first capacitance<<second capacitance), a resistance-capacitance (RC) value of the first horizontal line HL1 running through the first optical area OA1 and the second optical area OA2, which is referred to as a first RC value, may be greatly smaller than an RC value of the second horizontal lines HL2 disposed only in the normal area NA without running through the first optical area OA1 and the second optical area OA2, which is referred to as a second RC value, that is, resulting in the first RC value<<the second RC value.

Due to such a difference between the first RC value of the first horizontal line HL1 and the second RC value of the second horizontal line HL2, which is referred to as an RC load difference, a signal transmission characteristic through the first horizontal line HL1 may be different from a signal transmission characteristic through the second horizontal line HL2.

FIGS. 6 and 7 are cross-sectional views of each of the first optical area OA1, the second optical area OA2, and the normal area NA included in the display area DA of the display panel 110 according to aspects of the present disclosure.

FIG. 6 shows the display panel 110 in a case where a touch sensor is implemented outside of the display panel 110 in the form of a touch panel, and FIG. 7 shows the display panel 110 in a case where a touch sensor TS is implemented inside of the display panel 110.

Each of FIGS. 6 and 7 shows cross-sectional views of the normal area NA, the first optical area OA1, and the second optical area OA2 included in the display area DA.

A stack structure of the normal area NA will be described with reference to FIGS. 6 and 7. Respective light emitting areas EA of the first optical area OA1 and the second optical area OA2 may have the same stack structure as the light emitting area EA of the normal area NA1.

Referring to FIGS. 6 and 7, a substrate SUB may include a first substrate SUB1, an interlayer insulating layer IPD, and a second substrate SUB2. The interlayer insulating layer IPD may be interposed between the first substrate SUB1 and the second substrate SUB2. As the substrate SUB includes the first substrate SUB1, the interlayer insulating layer IPD, and the second substrate SUB2, the substrate SUB can prevent the penetration of moisture. The first substrate SUB1 and the second substrate SUB2 may be, for example, polyimide (PI) substrates. The first substrate SUB1 may be referred to as a primary PI substrate, and the second substrate SUB2 may be referred to as a secondary PI substrate.

Referring to FIGS. 6 and 7, various types of patterns ACT, SD1, GATE, for disposing one or more transistors such as a driving transistor DRT, and the like, various types of insulating layers MBUF, ABUF1, ABUF2, GI, ILD1, TLD2, PAS0, and various types of metal patterns TM, GM, ML1, ML2 may be disposed on or over the substrate SUB.

Referring to FIGS. 6 and 7, a multi-buffer layer MBUF may be disposed on the second substrate SUB2, and a first active buffer layer ABUF1 may be disposed on the multi-buffer layer MBUF.

A first metal layer ML1 and a second metal layer ML2 may be disposed on the first active buffer layer ABUF1. The first metal layer ML1 and the second metal layer ML2 may be, for example, a light shield layer LS for shielding light.

A second active buffer layer ABUF2 may be disposed on the first metal layer ML1 and the second metal layer ML2. An active layer ACT of the driving transistor DRT may be disposed on the second active buffer layer ABUF2.

Agate insulating layer GI may be disposed to cover the active layer ACT.

A gate electrode GATE of the driving transistor DRT may be disposed on the gate insulating layer GI. In this situation, together with the gate electrode GATE of the driving transistor DRT, a gate material layer GM may be disposed on the gate insulating layer GI at a location different from a location where the driving transistor DRT is disposed.

The first interlayer insulating layer ILD1 may be disposed to cover the gate electrode GATE and the gate material layer GM. A metal pattern TM may be disposed on the first interlayer insulating layer ILD1. The metal pattern TM may be located at a location different from a location where the driving transistor DRT is formed. A second interlayer insulating layer ILD2 may be disposed to cover the metal pattern TM on the first interlayer insulating layer ILD1.

Two first source-drain electrode patterns SD1 may be disposed on the second interlayer insulating layer ILD2. One of the two first source-drain electrode patterns SD1 may be a source node of the driving transistor DRT, and the other may be a drain node of the driving transistor DRT.

The two first source-drain electrode patterns SD1 may be electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping with the gate electrode GATE may serve as a channel region. One of the two first source-drain electrode patterns SD1 may be connected to the first side portion of the channel region of the active layer ACT, and the other of the two first source-drain electrode patterns SD1 may be connected to the second side portion of the channel region of the active layer ACT.

A passivation layer PAS0 may be disposed to cover the two first source-drain electrode patterns SD1. A planarization layer PLN may be disposed on the passivation layer PAS0. The planarization layer PLN may include a first planarization layer PLN1 and a second planarization layer PLN2.

The first planarization layer PLN1 may be disposed on the passivation layer PAS0.

A second source-drain electrode pattern SD2 may be disposed on the first planarization layer PLN1. The second source-drain electrode pattern SD2 may be connected to one of the two first source-drain electrode patterns SD1 (corresponding to the second node N2 of the driving transistor DRT in the subpixel SP of FIG. 3) through a contact hole formed in the first planarization layer PLN1.

The second planarization layer PLN2 may be disposed to cover the second source-drain electrode pattern SD2. A light emitting element ED may be disposed on the second planarization layer PLN2.

According an example stack structure of the light emitting element ED, an anode electrode AE may be disposed on the second planarization layer PLN2. The anode electrode AE may be electrically connected to the second source-drain electrode pattern SD2 through a contact hole formed in the second planarization layer PLN2.

A bank BANK may be disposed to cover a portion of the anode electrode AE. A portion of the bank BANK corresponding to a light emitting area EA of the subpixel SP may be opened.

A portion of the anode electrode AE may be exposed through the opening (the opened portion) of the bank BANK. An emission layer EL may be positioned on side surfaces of the bank BANK and in the opening (the opened portion) of the bank BANK. All or at least a portion of the emission layer EL may be located between adjacent banks.

In the opening of the bank BANK, the emission layer EL may contact the anode electrode AE. A cathode electrode CE may be disposed on the emission layer EL.

The light emitting element ED can be formed by including the anode electrode AE, the emission layer EL, and the cathode electrode CE, as described above. The emission layer EL may include an organic layer.

An encapsulation layer ENCAP may be disposed on the stack of the light emitting element ED.

The encapsulation layer ENCAP may have a single-layer structure or a multi-layer structure For example, as shown in FIGS. 6 and 7, the encapsulation layer ENCAP may include a first encapsulation layer PAS1, a second encapsulation layer PCL, and a third encapsulation layer PAS2.

The first encapsulation layer PAS1 and the third encapsulation layer PAS2 may be, for example, an inorganic layer, and the second encapsulation layer PCL may be, for example, an organic layer. Among the first encapsulation layer PAS1, the second encapsulation layer PCL, and the third encapsulation layer PAS2, the second encapsulation layer PCL may be the thickest and serve as a planarization layer.

The first encapsulation layer PAS1 may be disposed on the cathode electrode CE and may be disposed closest to the light emitting element ED. The first encapsulation layer PAS1 may include an inorganic insulating material capable of being deposited using low-temperature deposition. For example, the first encapsulation layer PAS1 may include, but not limited to, silicon nitride (SiNx), silicon oxide (SiOx), silicon oxynitride (SiON), aluminum oxide ($Al_2O_3$), or the like. Since the first encapsulation layer PAS1 can be deposited in a low temperature atmosphere, during the deposition process, the first encapsulation layer PAS1 can prevent the emission layer EL including an organic material vulnerable to a high temperature atmosphere from being damaged.

The second encapsulation layer PCL may have a smaller area or size than the first encapsulation layer PAS1. For example, the second encapsulation layer PCL may be disposed to expose both ends or edges of the first encapsulation layer PAS1. The second encapsulation layer PCL can serve as a buffer for relieving stress between corresponding layers while the display device 100 is curved or bent, and also serve to enhance planarization performance. For example, the second encapsulation layer PCL may include an organic insulating material, such as acrylic resin, epoxy resin, polyimide, polyethylene, silicon oxycarbon (SiOC), or the like. The second encapsulation layer PCL may be disposed, for example, using an inkjet scheme.

The third inorganic encapsulation layer PAS2 may be disposed over the substrate SUB over which the second encapsulation layer PCL is disposed such that the third inorganic encapsulation layer PAS2 covers the respective top surfaces and side surfaces of the second encapsulation layer PCL and the first encapsulation layer PAS1. The third encapsulation layer PAS2 can minimize or prevent external moisture or oxygen from penetrating into the first inorganic encapsulation layer PAS1 and the organic encapsulation layer PCL. For example, the third encapsulation layer PAS2 may include an inorganic insulating material, such as silicon nitride (SiNx), silicon oxide (SiOx), silicon oxynitride (SiON), aluminum oxide ($Al_2O_3$), or the like.

Referring to FIG. 7, in a case where a touch sensor TS is embedded into the display panel 110, the touch sensor TS may be disposed on the encapsulation layer ENCAP. The structure of the touch sensor will be described in detail as follows.

A touch buffer layer T-BUF may be disposed on the encapsulation layer ENCAP. The touch sensor TS may be disposed on the touch buffer layer T-BUF.

The touch sensor TS may include touch sensor metals TSM and at least one bridge metal BRG, which are located in different layers.

A touch interlayer insulating layer T-ILD may be disposed between the touch sensor metals TSM and the bridge metal BRG.

For example, the touch sensor metals TSM may include a first touch sensor metal TSM, a second touch sensor metal TSM, and a third touch sensor metal TSM, which are disposed adjacent to one another. In an aspect where the third touch sensor metal TSM is disposed between the first touch sensor metal TSM and the second touch sensor metal TSM, and the first touch sensor metal TSM and the second touch sensor metal TSM need to be electrically connected to each other, the first touch sensor metal TSM and the second touch sensor metal TSM may be electrically connected to each other through the bridge metal BRG located in a different layer. The bridge metal BRG may be electrically insulated from the third touch sensor metal TSM by the touch interlayer insulating layer T-ILD.

While the touch sensor TS is disposed on the display panel 110, a chemical solution (developer or etchant, etc.) used in the corresponding process or moisture from the outside may be generated or introduced. By disposing the touch sensor TS on the touch buffer layer T-BUF, a chemical solution or moisture can be prevented from penetrating into the emission layer EL including an organic material during the manufacturing process of the touch sensor TS.

Accordingly, the touch buffer layer T-BUF can prevent damage to the emission layer EL, which is vulnerable to a chemical solution or moisture.

In order to prevent damage to the emission layer EL including an organic material, which is vulnerable to high temperatures, the touch buffer layer T-BUF can be formed at a low temperature less than or equal to a predetermined temperature (e.g. 100 degrees (° C.)) and be formed using an organic insulating material having a low permittivity of 1 to 3. For example, the touch buffer layer T-BUF may include an acrylic-based, epoxy-based, or siloxan-based material. As the display device 100 is bent, the encapsulation layer ENCAP may be damaged, and the touch sensor metal located on the touch buffer layer T-BUF may be cracked or broken. Even when the display device 100 is bent, the touch buffer layer T-BUF having the planarization performance as the organic insulating material can prevent the damage of the encapsulation layer ENCAP and/or the cracking or breaking of the metals (TSM, BRG) included in the touch sensor TS.

A protective layer PAC may be disposed to cover the touch sensor TS. The protective layer PAC may be, for example, an organic insulating layer.

Next, a stack structure of the first optical area OA1 will be described with reference to FIGS. 6 and 7.

Referring to FIGS. 6 and 7, the light emitting area EA of the first optical area OA1 may have the same stack structure as that in the normal area NA. Accordingly, in the discussion that follows, instead of repeatedly describing the light emitting area EA in the first optical area OA1, a stack structure of the first transmission area TA1 in the first optical area OA1 will be described in detail below.

The cathode electrode CE may be disposed in the light emitting areas EA included in the normal area NA and the first optical area OA1, but may not be disposed in the first transmission area TA1 in the first optical area OA1. For example, the first transmission area TA1 in the first optical area OA1 may correspond to an opening of the cathode electrode CE.

Further, the light shield layer LS including at least one of the first metal layer ML1 and the second metal layer MHL2 may be disposed in the light emitting areas EA included in the normal area NA and the first optical area OA1, but may not be disposed in the first transmission area TA1 in the first optical area OA1. For example, the first transmission area TA1 in the first optical area OA1 may correspond to an opening of the light shield layer LS.

The substrate SUB1, SUB2, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the first optical area OA1 may be disposed in the first transmission area TA1 in the first optical area OA1 equally, substantially equally, or similarly.

However, all, or one or more, of one or more material layers having electrical properties (e.g., a metal material layer, a semiconductor layer, etc.), except for the insulating materials or layers, disposed in the light emitting areas EA included in the normal area NA and the first optical area OA1 may not be disposed in the first transmission area TA1 in the first optical area OA1.

For example, referring to FIGS. 6 and 7, all, or one or more, of the metal material layers (ML1, ML2, GATE, GM, TM, SD1, SD2) related to at least one transistor and the semiconductor layer ACT may not be disposed in the first transmission area TA1.

Further, referring to FIGS. 6 and 7, the anode electrode AE and the cathode electrode CE included in the light emitting element ED may not be disposed in the first transmission area TA1.

In some aspects, the emission layer EL of the light emitting element ED may or may not be disposed in the first transmission area TA1 according to a design requirement.

Further, referring to FIG. 7, the touch sensor metal TSM and the bridge metal BRG included in the touch sensor TS may not be disposed in the first transmission area TA1 in the first optical area OA1.

Accordingly, the light transmittance of the first transmission area TA1 in the first optical area OA1 can be provided or improved because the material layers (e.g., the metal material layer, the semiconductor layer, etc.) having electrical properties are not disposed in the first transmission area TA1 in the first optical area OA1. As a consequence, the first optical electronic device 11 can perform a predefined function (e.g., image sensing) by receiving light transmitting through the first transmission area TA1.

Since all, or one or more, of the first transmission area TA1 in the first optical area OA1 overlap with the first optical electronic device 11, for enabling the first optical electronic device 11 to normally operate, it is necessary to further increase a transmittance of the first transmission area TA1 in the first optical area OA1.

To do this, in some aspects, the first transmission area TA1 formed in the first optical area OA1 of the display panel 110 of the display device 100 may have a transmittance improvement structure TIS.

Referring to FIGS. 6 and 7, the plurality of insulating layers included in the display panel 110 may include the buffer layers (MBUF, ABUF1, ABUF2) between at least one substrate (SUB1, SUB2) and at least one transistor (DRT, SCT), the planarization layers (PLN1, PLN2) between the transistor DRT and the light emitting element ED, the encapsulation layer ENCAP on the light emitting element ED, and the like.

Referring to FIG. 7, the plurality of insulating layers included in the display panel 110 may further include the touch buffer layer T-BUF and the touch interlayer insulating layer T-ILD located on the encapsulation layer ENCAP, and the like.

Referring to FIGS. 6 and 7, the first transmission area TA1 in the first optical area OA1 can have a structure in which the first planarization layer PLN1 and the passivation layer PAS0 have depressed portions that extend downward from respective surfaces thereof as a transmittance improvement structure TIS.

Referring to FIGS. 6 and 7, among the plurality of insulating layers, the first planarization layer PLN1 may include at least one depression (or recess, trench, concave, protrusion, etc.). The first planarization layer PLN1 may be, for example, an organic insulating layer.

In a case where the first planarization layer PLN1 has the depressed portion that extends downward from the surfaces thereof, the second planarization layer PLN2 can substantially serve to planarize. In one aspect, the second planarization layer PLN2 may also have a depressed portion that extends downward from the surface thereof. In this case, the second encapsulation layer PCL can substantially serve to planarize.

Referring to FIGS. 6 and 7, the depressed portions of the first planarization layer PLN1 and the passivation layer PAS0 may pass through insulating layers, such as the first interlayer insulating layer ILD, the second interlayer insulating layer TLD2, the gate insulating layer GI, and the like, for forming the transistor DRT, and buffer layers, such as the first active buffer layer ABUF1, the second active buffer layer ABUF2, the multi-buffer layer MBUF, and the like, located under the insulating layers, and extend up to an upper portion of the second substrate SUB2.

Referring to FIGS. 6 and 7, the substrate SUB may include at least one concave portion or depressed portion as a transmittance improvement structure TIS. For example, in the first transmission area TA1, an upper portion of the second substrate SUB2 may be indented or depressed downward, or the second substrate SUB2 may be perforated.

Referring to FIGS. 6 and 7, the first encapsulation layer PAS1 and the second encapsulation layer PCL included in the encapsulation layer ENCAP may also have a transmittance improvement structure TIS in which the first encapsulation layer PAS1 and the second encapsulation layer PCL have depressed portions that extend downward from the respective surfaces thereof. The second encapsulation layer PCL may be, for example, an organic insulating layer.

Referring to FIG. 7, to protect the touch sensor TS, the protective layer PAC may be disposed to cover the touch sensor TS on the encapsulation layer ENCAP.

Referring to FIG. 7, the protective layer PAC may have at least one depression (or recess, trench, concave, protrusion, etc.) as a transmittance improvement structure TIS in a portion overlapping with the first transmission area TA1. The protective layer PAC may be, for example, an organic insulating layer.

Referring to FIG. 7, the touch sensor TS may include one or more touch sensor metals TSM with a mesh type. In a case where the touch sensor metal TSM is formed in the mesh type, a plurality of openings may be formed in the touch sensor metal TSM. Each of the plurality of openings may be located to correspond to the light emitting area EA of the subpixel SP.

In order for the first optical area OA1 to have a transmittance higher than the normal area NA, an area or size of the touch sensor metal TSM per unit area in the first optical area OA1 may be smaller than an area or size of the touch sensor metal TSM per unit area in the normal area NA.

Referring to FIG. 7, the touch sensor TS may be disposed in the light emitting area EA in the first optical area OA1, but may not be disposed in the first transmission area TA1 in the first optical area OA1.

Next, a stack structure of the second optical area OA2 will be described with reference to FIGS. 6 and 7.

Referring to FIGS. 6 and 7, the light emitting area EA of the second optical area OA2 may have the same stack structure as that of the normal area NA. Accordingly, in the discussion that follows, instead of repeatedly describing the light emitting area EA in the second optical area OA2, a stack structure of the second transmission area TA2 in the second optical area OA21 will be described in detail below.

The cathode electrode CE may be disposed in the light emitting areas EA included in the normal area NA and the second optical area OA2, but may not be disposed in the second transmission area TA2 in the second optical area OA2. For example, the second transmission area TA2 in the second optical area OA2 may be corresponded to an opening of the cathode electrode CE.

Further, the light shield layer LS including at least one of the first metal layer ML1 and the second metal layer MHL2 may be disposed in the light emitting areas EA included in the normal area NA and the second optical area OA2, but may not be disposed in the second transmission area TA2 in the second optical area OA2. For example, the second transmission area TA2 in the second optical area OA2 may be corresponded to an opening of the light shield layer LS.

When the transmittance of the second optical area OA2 and the transmittance of the first optical area OA1 are the same, the stack structure of the second transmission area TA2 in the second optical area OA2 may be the same as the stacked structure of the first transmission area TA1 in the first optical area OA1.

When the transmittance of the second optical area OA2 and the transmittance of the first optical area OA1 are different, the stack structure of the second transmission area TA2 in the second optical area OA2 may be different in at least a part from as the stacked structure of the first transmission area TA1 in the first optical area OA1.

For example, as shown in FIGS. 6 and 7, when the transmittance of the second optical area OA2 is lower than the transmittance of the first optical area OA1, the second transmission area TA2 in the second optical area OA2 may not have a transmittance improvement structure TIS. As a result, the first planarization layer PLN1 and the passivation layer PAS0 may not be indented or depressed. Further, a width of the second transmission area TA2 in the second optical area OA2 may be smaller than a width of the first transmission area TA1 in the first optical area OA1.

The substrate (SUB1, SUB2), and the various types of insulating layers (MBUF, ABUF1, ABUF2, GI, ILD1, TLD2, PAS0, PLN (PLN1, PLN2), BANK, ENCAP (PAS1, PCL, PAS2), T-BUF, T-TLD, PAC) disposed in the light emitting areas EA included in the normal area NA and the second optical area OA2 may be disposed in the second transmission area TA2 in the second optical area OA2 equally, substantially equally, or similarly.

However, all, or one or more, of one or more material layers having electrical properties (e.g., a metal material layer, a semiconductor layer, etc.), except for the insulating materials or layers, disposed in the light emitting areas EA included in the normal area NA and the second optical area OA2 may not be disposed in the second transmission area TA2 in the second optical area OA2.

For example, referring to FIGS. 6 and 7, all, or one or more, of the metal material layers (ML1, ML2, GATE, GM, TM, SD1, SD2) related to at least one transistor and the semiconductor layer ACT may not be disposed in the second transmission area TA2 in the second optical area OA2.

Further, referring to FIGS. 6 and 7, the anode electrode AE and the cathode electrode CE included in the light emitting element ED may not be disposed in the second transmission area TA2. In some aspects, the emission layer EL of the light emitting element ED may or may not be disposed on the second transmission area TA2 according to a design requirement.

Further, referring to FIG. 7, the touch sensor metal TSM and the bridge metal BRG included in the touch sensor TS may not be disposed in the second transmission area TA2 in the second optical area OA2.

Accordingly, the light transmittance of the second transmission area TA2 in the second optical area OA2 can be provided or improved because the material layers (e.g., the metal material layer, the semiconductor layer, etc.) having electrical properties are not disposed in the second transmission area TA2 in the second optical area OA2. As a consequence, the second optical electronic device 12 can perform a predefined function (e.g., approach detection of an aspect or human body, external illumination detection, etc.) by receiving light transmitting through the second transmission area TA2.

Figure 8:
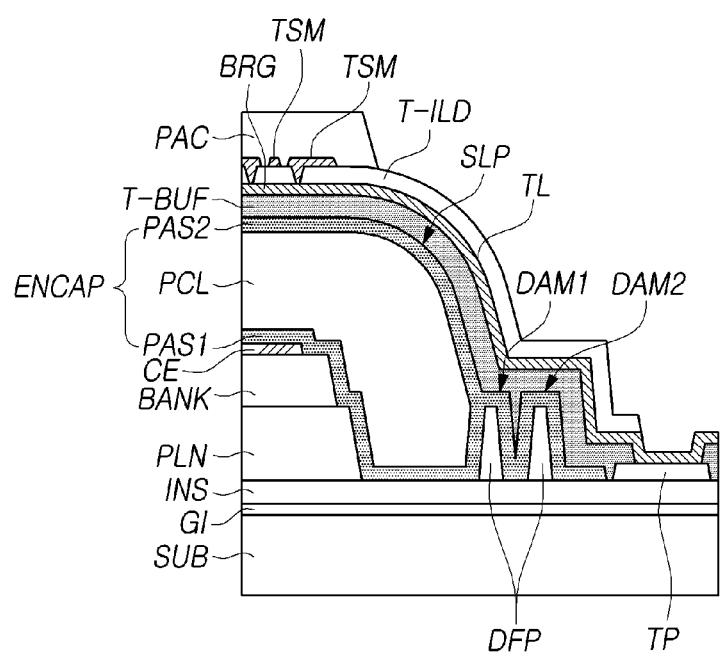
FIG. 8 is a cross-sectional view of an edge of the display panel according to aspects of the present disclosure.

FIG. 8 is a cross-sectional view of an edge of the display panel 110 according to aspects of the present disclosure.

For simplicity of illustration, FIG. 8 illustrates a single substrate SUB including the first substrate SUB1 and the second substrate SUB2, and layers or portions located under the bank BANK are shown in a simplified structure as well. Likewise, FIG. 8 illustrates a single planarization layer PLN including the first planarization layer PLN1 and the second planarization layer PLN2, and a single interlayer insulating layer INS including the second interlayer insulating layer TLD2 and the first interlayer insulating layer ILD1 located under the planarization layer PLN.

Referring to FIG. 8, the first encapsulation layer PAS1 may be disposed on the cathode electrode CE and disposed closest to the light emitting element ED. The second encapsulation layer PCL may have a smaller area or size than the first encapsulation layer PAS1. For example, the second encapsulation layer PCL may be disposed to expose both ends or edges of the first encapsulation layer PAS1.

The third inorganic encapsulation layer PAS2 may be disposed over the substrate SUB over which the second encapsulation layer PCL is disposed such that the third inorganic encapsulation layer PAS2 covers the respective top surfaces and side surfaces of the second encapsulation layer PCL and the first encapsulation layer PAS1.

The third encapsulation layer PAS2 can minimize or prevent external moisture or oxygen from penetrating into the first inorganic encapsulation layer PAS1 and the organic encapsulation layer PCL.

Referring to FIG. 8, in order to prevent the encapsulation layer ENCAP from collapsing, the display panel 110 may include one or more dams (DAM1, DAM2) at, or near to, an end or edge of an inclined surface SLP of the encapsulation layer ENCAP. The one or more dams (DAM1, DAM2) may be present at, or near to, a boundary point between the display area DA and the non-display area NDA.

The one or more dams (DAM1, DAM2) may include the same material DFP as the bank BANK.

Referring to FIG. 8, in one aspect, the second encapsulation layer PCL including an organic material may be located only on an inner side of a first dam DAM1, which is located closest to the inclined surface SLP of the encapsulation layer ENCAP among the dams. For example, the second encapsulation layer PCL may not be located on all of the dams (DAM1, DAM2). In another aspect, the second encapsulation layer PCL including an organic material may be located on at least the first dam DAM1 of the first dam DAM1 and a second dam DAM2.

For example, the second encapsulation layer PCL may extend only up to all, or at least a portion, of an upper portion of the first dam DAM1. In further another aspect, the second encapsulation layer PCL may extend past the upper portion of the first dam DAM1 and extend up to all, or at least a portion of, an upper portion of the secondary dam DAM2.

Referring to FIG. 8, a touch pad TP, to which the touch driving circuit 260 is electrically connected, may be disposed on a portion of the substrate SUB outside of the one or more dams (DAM1, DAM2).

A touch line TL can electrically connect, to the touch pad TP, the touch sensor metal TSM or the bridge metal BRG included in, or serving as, a touch electrode disposed in the display area DA.

One end or edge of the touch line TL may be electrically connected to the touch sensor metal TSM or the bridge metal BRG, and the other end or edge of the touch line TL may be electrically connected to the touch pad TP.

The touch line TL may run downward along the inclined surface SLP of the encapsulation layer ENCAP, run along the respective upper portions of the dams DAM1, DAM2, and extend up to the touch pad TP disposed outside of the dams (DAM1, DAM2).

Referring to FIG. 8, in one aspect, the touch line TL may be the bridge metal BRG. In another aspect, the touch line TL may be the touch sensor metal TSM.

Figure 9:
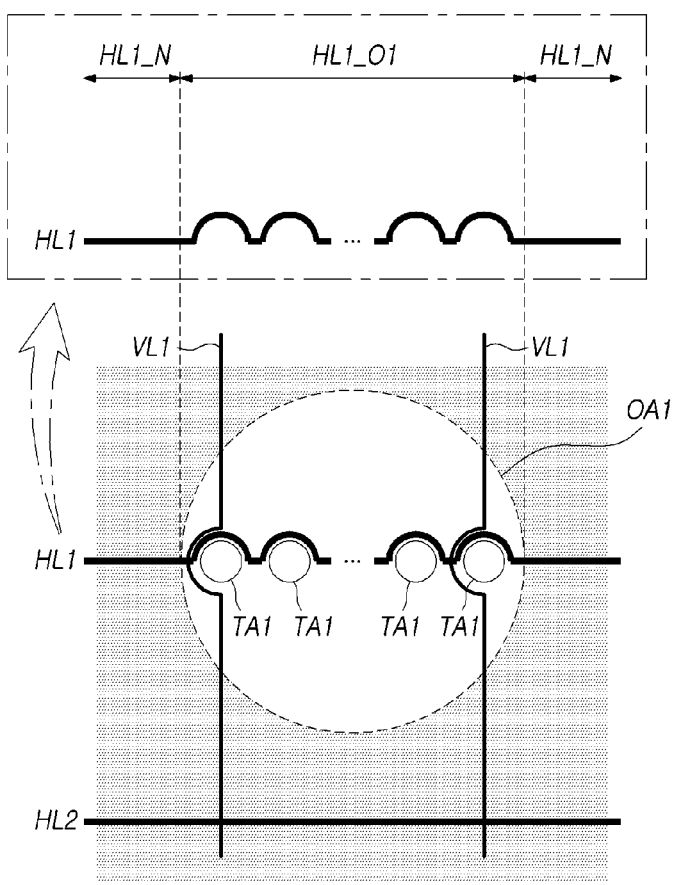
FIG. 9 illustrates a first horizontal line and a second horizontal line of the display panel according to aspects of the present disclosure.

FIG. 9 illustrates a first horizontal line HL1 and a second horizontal line HL2 of the display panel 110 according to aspects of the present disclosure.

Referring to FIG. 9, the first horizontal area HA1 may include a first optical area OA1 and a normal area NA, and the second horizontal area HA2 may include only the normal area NA.

Referring to FIG. 9, the first horizontal line HL1 disposed in the first horizontal area HA1 may run through the first optical area OA1. The second horizontal line HL2 may be disposed only in the normal area NA without being disposed in the first optical area OA1.

For example, the first horizontal line HL1 and the second horizontal line HL2 may be gate lines for supplying gate signals to sub-pixels SP in the first optical area OA1. The gate signals may include one or more of a scan signal, a light emitting control signal, an initialization signal, and the like.

Referring to FIG. 9, first vertical lines VL1 may run through both the first optical area OA1 and the normal area NA. The first vertical lines VL1 may cross the first horizontal line HL1 and the second horizontal line HL2.

For example, the first vertical lines VL1 may be driving voltage lines DVL for supplying a driving voltage ELVDD to sub-pixels SP. In another example, the first vertical lines VL1 may be data lines DL for supplying data voltages Vdata to the sub-pixels SP.

For example, the first vertical lines VL1 may be driving voltage lines for supplying a driving voltage ELVDD to sub-pixels SP in the first optical area OA1. In another example, the first vertical lines VL1 may be reference voltage lines for supplying a reference voltage to the sub-pixels SP in the first optical area OA1. In further another example, the first vertical lines VL1 may be data lines for supplying data voltages to the sub-pixels SP in the first optical area OA1.

Referring to FIG. 9, the first vertical lines VL1 may run around outer edges of first transmission areas TA1 in the first optical area OA1.

Accordingly, in the first optical area OA1, the first vertical line VL1 may include curved portions or bending portions.

Referring to FIG. 9, the first horizontal line HL1 may include a first optical horizontal line portion HL1_O1 disposed in the first optical area OA1, and a non-optical horizontal line portion HL1_N disposed in the normal area NA.

Referring to FIG. 9, in the first optical area OA1, the first horizontal line HL1 may include curved portions or bending portions. For example, the first optical horizontal line portion HL1_O1 of the first horizontal line HL1 may run around outer edges of the first transmission areas TA1 in the first optical area OA1.

Accordingly, the first optical horizontal line portion HL1_O1 of the first horizontal line HL1 may include curved portions or bending portions.

However, since the second horizontal line HL2 is disposed only in the normal area NA without running through the first optical area OA1, the second horizontal line HL2 does not include curved portions or bending portions running around the outer edges of the first transmission areas TA1.

As described above, since the number of sub-pixels per unit area of the first optical area OA1 is smaller than the number of sub-pixels per unit area of the normal area NA, a first RC value of the first horizontal line HL1 running through the first optical area OA1 may be smaller than a second RC value of the second horizontal line HL2.

Due to a difference in RC loads between the first horizontal line HL1 and the second horizontal line HL2, a signal transmission characteristic through the first horizontal line HL1 and a signal transmission characteristic through the second horizontal line HL2 may be different from each other, this leading image quality to become poor.

To address this issue, the display device 100 according to aspects of the present disclosure can have a structure for compensating for a difference in RC loads (hereinafter, referred to as "RC load difference compensation structure") between the first horizontal line HL1 running through the first optical area OA1 and the second horizontal line HL2 disposed only in the normal area NA. Hereinafter, the RC load difference compensation structure will be described.

Figure 10:
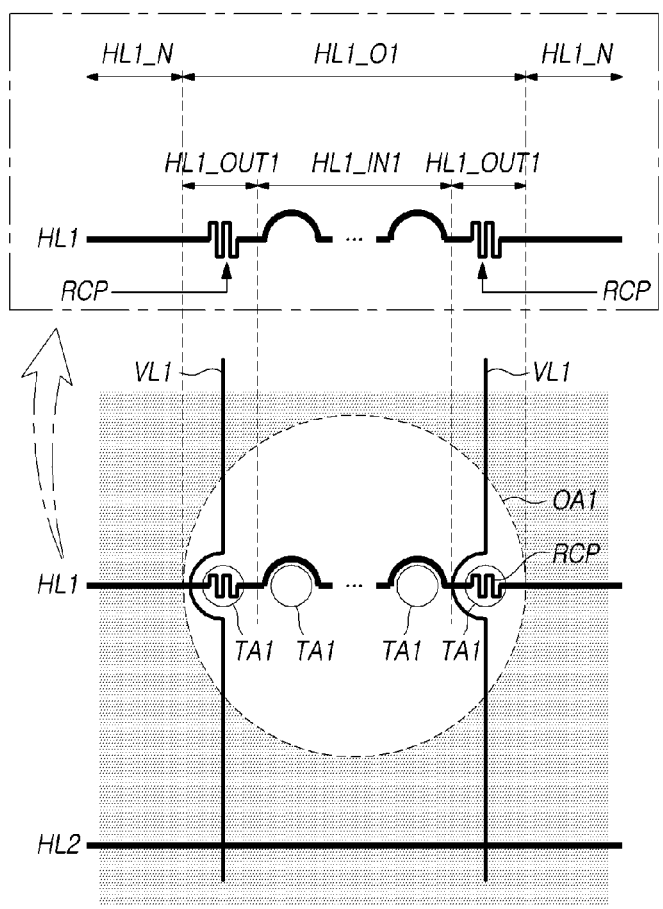
FIGS. 10 to 12 illustrate structures of compensating for a difference in RC loads ("RC load difference compensation structure") between a first horizontal line running through the first optical area and a second horizontal line not running through the first optical area in the display panel according to aspects of the present disclosure.
Figure 11:
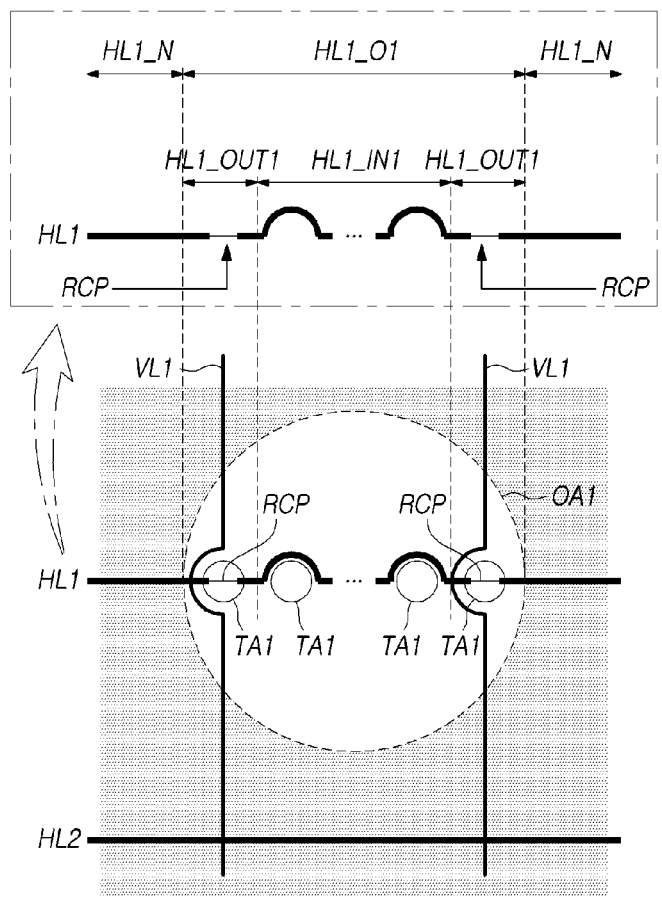
Figure 12:
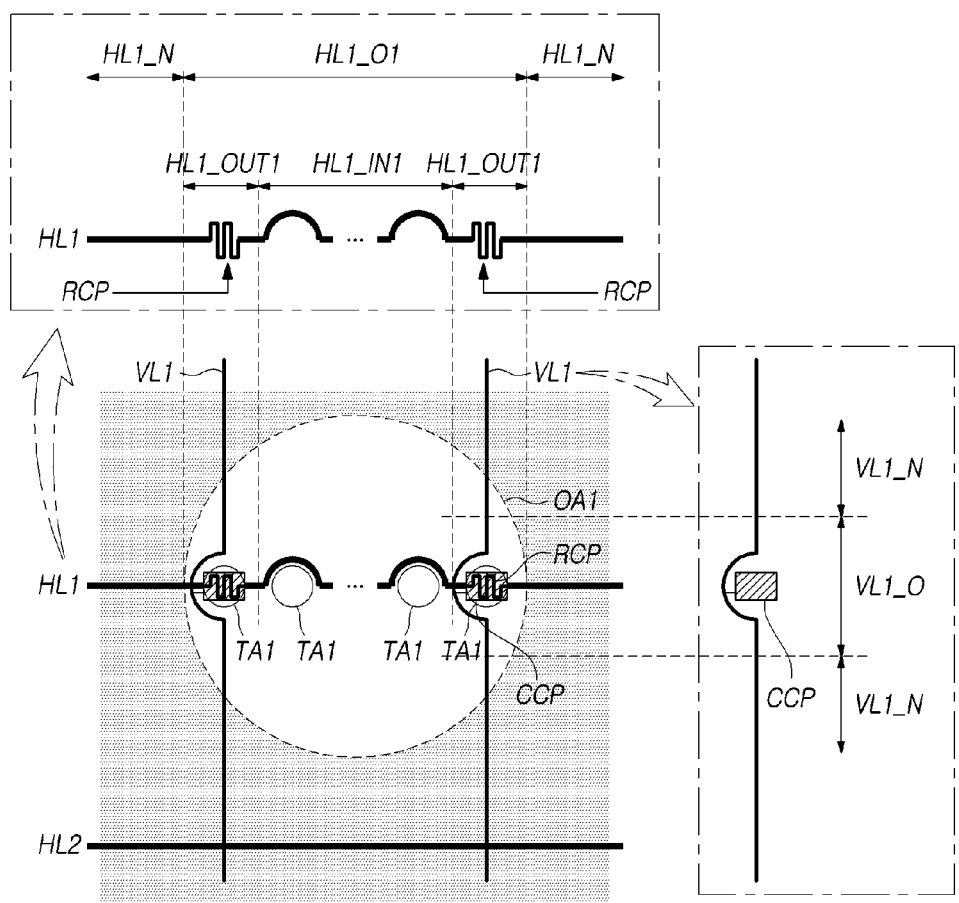

FIGS. 10 to 12 illustrate RC load difference compensation structures between a first horizontal line HL1 running through the first optical area OA1 and a second horizontal line HL2 not running through the first optical area OA1 in the display panel 110 according to aspects of the present disclosure.

In some aspects, when the display device 100 includes the first optical electronic device 11 located under, at a lower portion of, the display panel 110, as shown in FIG. 1A, the first horizontal line HL1 disposed in the horizontal area HA1 may run through the first optical area OA1 as well as the normal area NA.

In some aspects, in the display panel 110 of the display device 100, the number of sub-pixels per unit area of the first optical area OA1 may be smaller than the number of sub-pixels per unit area of the normal area NA. Accordingly, the resolution of the first optical area OA1 may be lower than that of the normal area NA.

In some aspects, when the display device 100 includes the first and second optical electronic devices 11 and 12 located under, at a lower portion of, the display panel 110, as shown in FIGS. 1B and 1C, the first horizontal line HL1 disposed in the horizontal area HA1 may run through the first and second optical areas OA1 and OA2 as well as the normal area NA.

For example, the first optical electronic device 11 overlapping with all or a portion of the first optical area OA1 may be a camera, and the second optical electronic device 12 overlapping with all or a portion of the second optical area OA2 may be a sensor such as a proximity sensor, an illuminance sensor, and/or the like. For example, the sensor may be an illuminance sensor, or a proximity sensor that is an infrared sensor.

To normally operate, the camera may require a more amount of light than such a sensor. Accordingly, when the first optical electronic device 11 overlapping with all or a portion of the first optical area OA1 is a camera, the transmittance of the first optical area OA1 may be greater than or equal to the transmittance of the second optical area OA2.

In some aspects, a cathode electrode CE included in the display panel 110 of the display device 100 may be disposed in the plurality of light emitting areas EA, and may not be disposed in the plurality of transmission areas (TA1, TA2).

Accordingly, the area in which the cathode electrode CE is disposed may be classified into the light emitting area EA, and the area in which the cathode electrode CE is not disposed may be classified into the transmission areas (TA1, TA2).

The light emitting area EA may be included in each of the normal area NA, the first optical area OA1, and the second optical area OA2. The transmission areas (TA1, TA2) may be included in each of the first optical area OA1 and the second optical area OA2, and may not be included in the normal area NA.

In some aspects, the display panel 110 of the display device 100 may further include a light shield layer LS disposed under transistors in the plurality of light emitting areas EA and not disposed in the plurality of transmission areas (TA1, TA2).

Accordingly, the area in which the light shield layer LS is disposed may be classified into the light emitting area EA, and the area in which the light shield layer LS is not disposed may be classified into the transmission areas (TA1, TA2).

The light emitting area EA may be included in each of the normal area NA, the first optical area OA1, and the second optical area OA2. The transmission areas (TA1, TA2) may be included in each of the first optical area OA1 and the second optical area OA2, and may not be included in the normal area NA.

In some aspects, the display device 100 may include the display panel 110 and the first optical electronic device 11 located under, at a lower portion of, the display panel 110.

The display panel 110 may include a plurality of signal lines and may include the display area DA and the non-display area NDA.

In the display panel 110, the display area DA may include the first optical area OA1 and the normal area NA located outside of the first optical area OA1.

The first optical area OA1 in the display area DA may include the plurality of light emitting areas EA and the plurality of first transmission areas TA1. The normal area NA in the display area DA may include the plurality of light emitting areas EA.

The first optical electronic device 11 may overlap with at least a portion of the first optical area OA1 included in the display area DA.

The plurality of signal lines may include the first horizontal line HL1 disposed in the first horizontal area HA1 and the second horizontal line HL2 disposed in the second horizontal area HA2.

The first horizontal area HA1 may include the normal area NA, the first optical area OA1, and the second optical area OA2. The second horizontal area HA2 may include only the normal area NA.

Referring to FIGS. 10 to 12, the first horizontal line HL1 may include a first optical horizontal line portion HL_O1 disposed in the first optical area OA1, and a non-optical horizontal line portion HL1_N disposed in the normal area NA.

The second horizontal line HL2 may be disposed in the normal area NA without being disposed in the first optical area OA1.

Referring to FIGS. 10 to 12, the first optical horizontal line portion HL1_O1 of the first horizontal line HL1 may include a first outer horizontal line portion HL1_OUT1 and a first inner horizontal line portion HL1_IN1.

In the first optical horizontal line portion HL1_O1 of the first horizontal line HL1, the first outer horizontal line portion HL1_OUT1 may be disposed in an outer area of the first optical area OA1. For example, in the first optical horizontal line portion HL1_O1 of the first horizontal line HL1, the first outer horizontal line portion HL1_OUT1 may be a portion of the first optical horizontal line portion HL1_O1 disposed in the outer area of the first optical area OA1.

Referring to FIGS. 10 to 12, the configuration of the first outer horizontal line portion HL1_OUT1 can be described, for example, such that one of two or more portions of the first outer horizontal line portion HL1_OUT1 corresponds to one first transmission area TA1 located in an outer area of the first optical area OA1, and another of the two or more portions corresponds to another first transmission area TA1 located in another outer area of the first optical area OA1. In another example, the configuration of the first outer horizontal line portion HL1_OUT1 can be described such that one of the two or more first outer horizontal line portions corresponds to one first transmission area TA1 located in an outer area of the first optical area OA1, and another of the two or more first outer horizontal line portions corresponds to another first transmission area TA1 located in another outer area of the first optical area OA1. Thus, the configuration of the first outer horizontal line portion HL1_OUT1 can be implemented according to these two examples.

Referring to FIGS. 10 to 12, in the first optical horizontal line portion HL1_O1 of the first horizontal line HL1, the first inner horizontal line portion HL1_IN1 may be located inside of the first outer horizontal line portion HL1_OUT1 in the first optical area OA1, or located between two first outer horizontal line portions HL1_OUT1 in the first optical area OA1. For example, in the first optical horizontal line portion HL1_O1 of the first horizontal line HL1, the first inner horizontal line portion HL1_IN1 may correspond to a portion except for one or more portions disposed in one or more outer areas of the first optical area OA1.

In order to reduce a difference (RC load difference) between an RC value of the first horizontal line HL1 and an RC value of the second horizontal line HL2, that is, to compensate for the RC load difference, a length per unit area of the first horizontal line HL1 may be adjusted as shown in FIGS. 10 and 12, or a width of the first horizontal line HL1 may be adjusted as shown in FIG. 11.

For example, referring to FIGS. 10 and 12, in the first optical horizontal line portion HL1_O1 of the first horizontal line HL1, a length per unit area of the first outer horizontal line portion HL1_OUT1 may be greater than that of the first inner horizontal line portion HL1_IN1 or that of the non-optical horizontal line portion HL1_N.

For example, referring to FIG. 11, a width of all or a portion of the first horizontal line HL1 may be smaller than a width of the second horizontal line HL2. For example, a width of the first outer horizontal line portion HL1_OUT1 may be smaller than that of the first inner horizontal line portion HL1_IN1.

Referring to FIGS. 10 to 12, in the first optical horizontal line portion HL1_O1 of the first horizontal line HL1, the first inner horizontal line portion HL1_IN1 may be disposed to avoid the plurality of first transmission areas TA1 in the first optical area OA1.

Referring to FIGS. 10 to 12, in the first optical horizontal line portion HL1_O1 of the first horizontal line HL1, the first outer horizontal line portion HL1_OUT1 may be disposed in at least one first transmission area TA1 disposed in an outer area of the first optical area OA1 among the plurality of first transmission areas TA1 in the first optical area OA1.

Referring to FIGS. 10 to 12, in the first optical horizontal line portion HL1_O1 of the first horizontal line HL1, the first outer horizontal line portion HL1_OUT1 may include a resistive compensation pattern RCP having a different shape or a different width from the first inner horizontal line portion HL1_IN1.

Referring to FIG. 11, the resistive compensation pattern RCP may have a different width from the first inner horizontal line portion HL1_IN1. For example, a width of the resistive compensation pattern RCP may be smaller than that of the first inner horizontal line portion HL1_IN1.

The resistance value of the first horizontal line HL1 may increase by the resistive compensation pattern RCP, and thereby, the RC value of the first horizontal line HL1 may increase. Accordingly, an RC load difference between the first horizontal line HL1 and the second horizontal line HL2 may be reduced.

Referring to FIGS. 10 and 12, the resistive compensation pattern RCP may have a different shape from the first inner horizontal line portion HL1_IN1. For example, the resistive compensation pattern RCP may have at least one of a zigzag shape, a spiral shape, a mesh shape, and the like.

Referring to FIGS. 10 to 12, the plurality of signal lines may further include one or more first vertical lines VL1 intersecting the first horizontal line HL1.

Referring to FIG. 12, the first vertical line VL1 may include a first optical vertical line portion VL1_O disposed in the first optical area OA1, and a first non-optical vertical line portion VL1_N disposed in the normal area NA.

Referring to FIG. 12, the first vertical line VL1 may further include a capacitive compensation pattern CCP formed by the expanding or protruding of the first optical vertical line portion VL1_O.

Referring to FIG. 12, all or a portion of the capacitive compensation pattern CCP may overlap with the resistive compensation pattern RCP.

As all or a portion of the capacitive compensation pattern CCP overlaps with the resistive compensation pattern RCP, a capacitance value of the first horizontal line HL1 may increase. Accordingly, a difference between the capacitance value of the first horizontal line HL1 and the capacitance value of the second horizontal line HL2 may be greatly reduced.

As the capacitance value of the first horizontal line HL1 increases through the overlapping of all or a portion of the capacitive compensation pattern CCP with the resistive compensation pattern RCP, an RC value of the first horizontal line HL1 may significantly increase.

The increased RC value of the first horizontal line HL1 may be similar to the RC value of the second horizontal line HL2. Accordingly, an RC load difference between the first horizontal line HL1 and the second horizontal line HL2 may be reduced or nearly eliminated.

Referring to FIGS. 10 to 12, the first horizontal line HL1 may be a signal line (i.e., the gate line GL) for supplying a gate signal to sub-pixels SP disposed in the display panel 110.

The sub-pixels SP receiving the gate signal through the first horizontal line HL1 may include sub-pixels SP disposed in the first optical area OA1 and sub-pixels SP disposed in the normal area NA.

Referring to FIGS. 10 to 12, the first vertical line VL1 may be a signal line (e.g., the driving voltage line DVL) for supplying a driving voltage ELVDD to sub-pixels SP disposed in the display panel 110.

The sub-pixels SP receiving the driving voltage through the first vertical line VL1 may include sub-pixels SP disposed in the first optical area OA1 and sub-pixels SP disposed in the normal area NA.

Referring to FIGS. 10 to 12, the first outer horizontal line portion HL1_OUT1 and the first inner horizontal line portion HL1_IN1 included in the first optical horizontal line portion HL1_O1 of the first horizontal line HL1 may disposed in the same layer.

Referring to FIGS. 10 to 12, the first outer horizontal line portion HL1_OUT1 and the first inner horizontal line portion HL1_IN1 included in the first optical horizontal line portion HL1_O1 of the first horizontal line HL1 may disposed in different layers from each other.

Referring to FIGS. 10 to 12, among the first outer horizontal line portion HL1_OUT1 and the first inner horizontal line portion HL1_IN1 included in the first optical horizontal line portion HL1_O1 of the first horizontal line HL1, the first outer horizontal line portion HL1_OUT1 may be a portion of the first optical horizontal line portion HL1_O1 disposed in the first transmission area TA1, and the first inner horizontal line portion HL1_IN1 may be a portion of the first optical horizontal line portion HL1_O1 disposed a portion different from the first transmission area TAL.

Referring to FIGS. 10 to 12, the first outer horizontal line portion HL1_OUT1 and the first inner horizontal line portion HL1_IN1 included in the first optical horizontal line portion HL1_O1 of the first horizontal line HL1 may disposed in different layers from each other.

The first horizontal line HL1 and the second horizontal line HL2 may be signal lines for transmitting the same type of signal.

As described above, since the first horizontal line HL1 is a signal line running through the first optical area OA1 and the second horizontal line HL2 is a signal line disposed only in the normal area NA, a length of the first horizontal line HL1 may be different from a length of the second horizontal line HL2. For example, the length of the first horizontal line HL1 may be greater than the length of the second horizontal line HL2.

Thus, although a difference in length between the first horizontal line HL1 and the second horizontal line HL2 is present, when the RC load difference compensation technique according to aspects of the present disclosure is applied, an RC value of the second horizontal line HL2 may be substantially the same as an RC value of the first horizontal line HL1.

Figure 13:
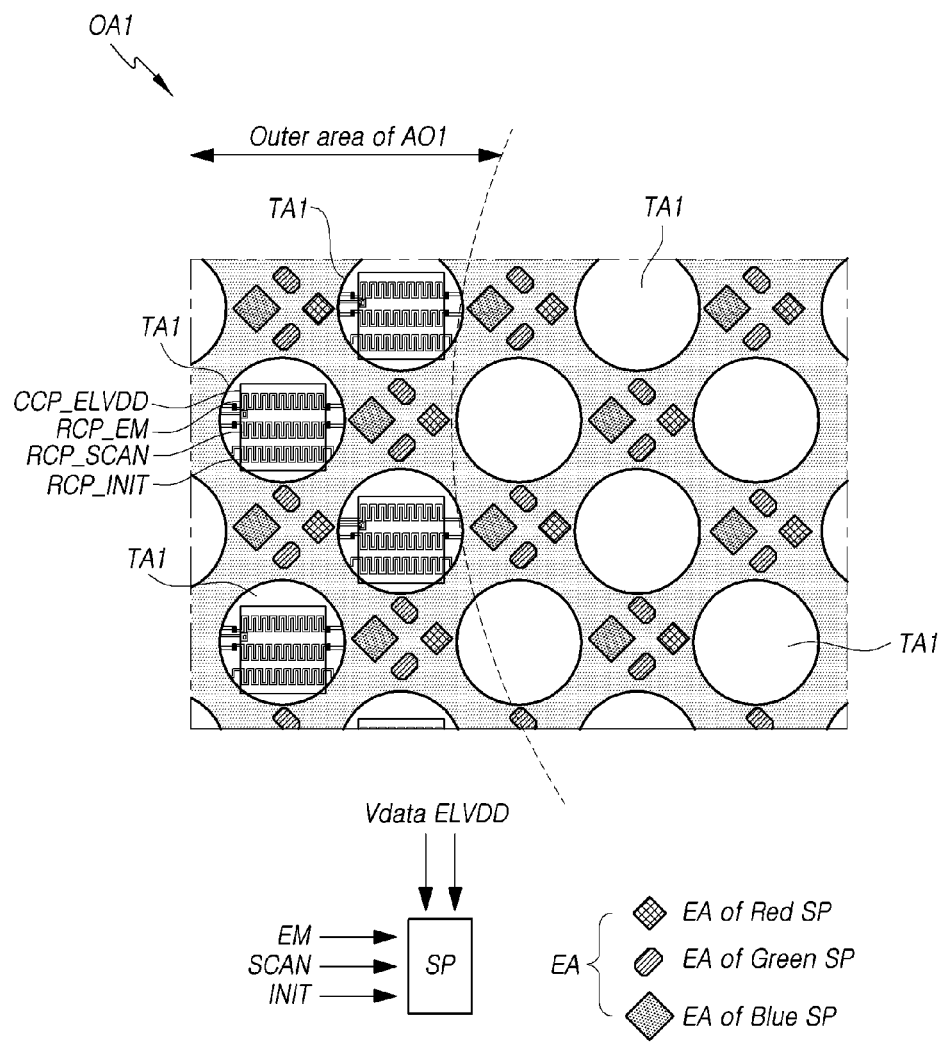
FIG. 13 illustrates an outer area of the first optical area to which the RC load difference compensation structure of FIG. 12 is applied.
Figure 14A:
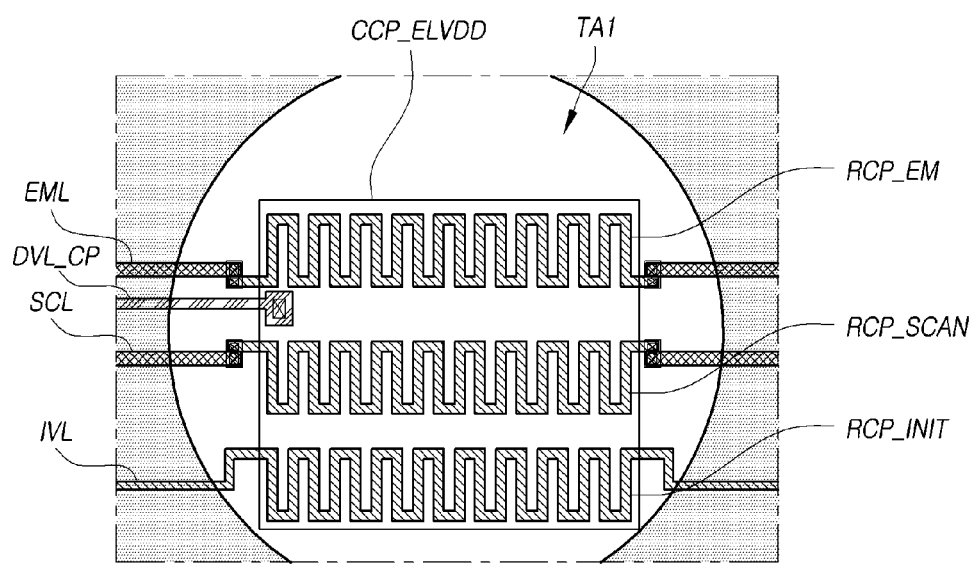
FIGS. 14A and 14B are enlarged views of the first transmission area in which at least one resistive compensation pattern and at least one capacitive compensation pattern of FIG. 13 are formed.
Figure 14B:
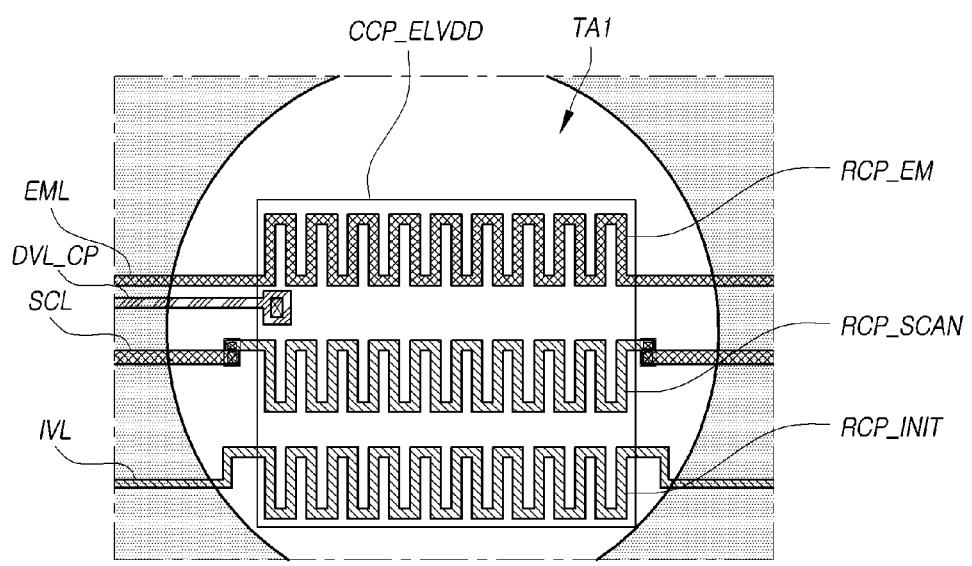

FIG. 13 illustrates an outer area of the first optical area OA1 to which the RC load difference compensation structure of FIG. 12 is applied. FIGS. 14A and 14B are enlarged views of first transmission areas TA1 in which the resistive compensation pattern (RCP_EM, RCP_SCAN, RCP_INIT) and the capacitive compensation pattern (CCP_ELVDD) of FIG. 13 are formed.

Referring to FIGS. 13, 14A, and 14B, for example, each of a red sub-pixel Red SP, a green sub-pixel Green SP, and a blue sub-pixel Blue SP disposed in the first optical area OA1 may receive a driving voltage ELVDD, and receive three types of gate signals including a lighting emitting control signal EM, a scan signal SCAN, and an initialization signal INIT.

Referring to FIGS. 13, 14A, and 14B, first horizontal lines HL1 running through the first optical area OA1 may include a lighting emitting control signal line EML for delivering the lighting emitting control signal EM, a scan signal line SCL for delivering the scan signal SCAN, and an initialization signal line IVL for delivering the initialization signal INIT.

The lighting emitting control signal line EML, the scan signal line SCL, and the initialization signal line IVL are examples of the three types of gate lines GL.

Referring to FIGS. 13, 14A, and 14B, resistive compensation patterns (RCP_EM, RCP_SCAN, RCP_INIT) and a capacitive compensation pattern CCP_ELVDD may be disposed in each of the first transmission areas TA1 disposed in an outer area of the first optical area OA1.

The resistive compensation patterns (RCP_EM, RCP_SCAN, RCP_INIT) disposed in each of the first transmission areas TA1 disposed in the outer area of the first optical area OA1 may include a first resistive compensation pattern RCP_EM connected to a light emitting control signal line EML, which is one type of the first horizontal line HL1, a second resistive compensation pattern RCP_SCAN connected to a scan signal line SCL, which is another type of the first horizontal line HL1, and a third resistive compensation pattern RCP_INIT connected to an initialization signal line IVL, which is further another type of the first horizontal line HLL.

A portion (i.e., a first outer horizontal line portion HL1_OUT1) of the light emitting control signal line EML located in the outer area of the first optical area OA1 may be formed with the first resistive compensation pattern RCP_EM. The first resistive compensation pattern RCP_EM may be disposed in one or more first transmission areas TA1 in the outer area of the first optical area OA1.

A portion (i.e., a first outer horizontal line portion HL1_OUT1) of the scan signal line SCL located in the outer area of the first optical area OA1 may be formed with the second resistive compensation pattern RCP_SCAN. The second resistive compensation pattern RCP_SCAN may be disposed in one or more first transmission areas TA1 in the outer area of the first optical area OA1.

A portion (i.e., a first outer horizontal line portion HL1_OUT1) of the initialization signal line IVL located in the outer area of the first optical area OA1 may be formed with the third resistive compensation pattern RCP_INIT. The third resistive compensation pattern RCP_INIT may be disposed in one or more first transmission areas TA1 in the outer area of the first optical area OA1.

Referring to FIG. 14A, the first resistive compensation pattern RCP_EM, the second resistive compensation pattern RCP_SCAN, and the third resistive compensation pattern RCP_INIT may be located in a same layer. For example, the first resistive compensation pattern RCP_EM, the second resistive compensation pattern RCP_SCAN, and the third resistive compensation pattern RCP_INIT may include a same material.

Referring to FIG. 14B, among the first resistive compensation pattern RCP_EM, the second resistive compensation pattern RCP_SCAN, and the third resistive compensation pattern RCP_INIT, the first resistive compensation pattern RCP_EM may be located in a different layer from the second resistive compensation pattern RCP_SCAN and the third resistive compensation pattern RCP_INIT. For example, among the first resistive compensation pattern RCP_EM, the second resistive compensation pattern RCP_SCAN, and the third resistive compensation pattern RCP_INIT, the first resistive compensation pattern RCP_EM may include a different material from the second resistive compensation pattern RCP_SCAN and the third resistive compensation pattern RCP_INIT.

Referring to FIGS. 14A and 14B, the light emitting control signal line EML may include the first outer horizontal line portion HL1_OUT1 in which the first resistive compensation pattern RCP_EM disposed in the first transmission area TA1 is formed. The scan signal line SCL may include the first outer horizontal line portion HL1_OUT1 in which the second resistive compensation pattern RCP_SCAN disposed in the first transmission area TA1 is formed. The initialization signal line IVL may include the first outer horizontal line portion HL1_OUT1 in which the third resistive compensation pattern RCP_INIT disposed in the first transmission area TA1 is formed.

Referring to FIGS. 14A and 14B, the first outer horizontal line portion HL1_OUT1 of the light emitting control signal line EML, the first outer horizontal line portion HL1_OUT1 of the scan signal line SCL, and the first outer horizontal line portion HL1_OUT1 of the initialization signal line IVL may be respective portions of these lines disposed in the first transmission area TA1.

Referring to FIG. 14A, the first outer horizontal line portion HL1_OUT1 of the light emitting control signal line EML may be located in a different layer from the remaining portion of the light emitting control signal line EML not disposed in the first transmission area TAL. For example, the remaining portion of the light emitting control signal line EML not disposed in the first transmission area TA1 may include a first material, and the first outer horizontal line portion HL1_OUT1 of the light emitting control signal line EML may include a second material different from the first material.

Referring to FIG. 14B, the first outer horizontal line portion HL1_OUT1 of the light emitting control signal line EML may be located in the same layer as the remaining portion of the light emitting control signal line EML not disposed in the first transmission area TAL. For example, the remaining portion of the light emitting control signal line EML not disposed in the first transmission area TA1 may include the first material, and the first outer horizontal line portion HL1_OUT1 of the light emitting control signal line EML may also include the first material.

Referring to FIG. 14A, the first outer horizontal line portion HL1_OUT1 of the scan signal line SCL may be located in a different layer from the remaining portion of the scan signal line SCL not disposed in the first transmission area TAL. For example, the remaining portion of the scan signal line SCL not disposed in the first transmission area TA1 may include a first material, and the first outer horizontal line portion HL1_OUT1 of the scan signal line SCL may include a second material different from the first material.

Referring to FIG. 14B, the first outer horizontal line portion HL1_OUT1 of the scan signal line SCL may be located in a different layer from the remaining portion of the scan signal line SCL not disposed in the first transmission area TAL. For example, the remaining portion of the scan signal line SCL not disposed in the first transmission area TA1 may include the first material, and the first outer horizontal line portion HL1_OUT1 of the scan signal line SCL may include the second material different from the first material.

Referring to FIG. 14A, the first outer horizontal line portion HL1_OUT1 of the initialization signal line IVL may be located in the same layer as the remaining portion of the initialization signal line IVL not disposed in the first transmission area TAL. For example, the remaining portion of the initialization signal line IVL not disposed in the first transmission area TA1 may include a second material, and the first outer horizontal line portion HL1_OUT1 of the initialization signal line IVL may also include the second material.

Referring to FIG. 14B, the first outer horizontal line portion HL1_OUT1 of the initialization signal line IVL may be located in the same layer from the remaining portion of the initialization signal line IVL not disposed in the first transmission area TAL. For example, the remaining portion of the initialization signal line IVL not disposed in the first transmission area TA1 may include the second material, and the first outer horizontal line portion HL1_OUT1 of the initialization signal line IVL may also include the second material.

Referring to FIGS. 14A and 14B, a capacitive compensation pattern CCP_ELVDD may be disposed in the first transmission area TA1 in which the first to third resistive compensation patterns (RCP_EM, RCP_SCAN, and RCP_INIT) are disposed. The capacitive compensation pattern CCP_ELVDD may be connected to the driving voltage line DVL, which is one type of the first vertical line VL1, through a connection pattern DVL_CP.

As the first to third resistive compensation patterns (RCP_EM, RCP_SCAN, and RCP_INIT) overlap with the capacitive compensation pattern CCP_ELVDD in one first transmission area TA1, respective capacitance value of each of the light emitting control signal line EML, the scan signal line SCL, and the initialization signal line IVL, which are first horizontal lines HL1, may increase.

Accordingly, a respective RC load of each of the light emitting control signal line EML, the scan signal line SCL, and the initialization signal line IVL, which are first horizontal lines HL1, may increase.

Accordingly, a difference in RC loads between the light emitting control signal line EML disposed in the first horizontal area HA1 and the light emitting control signal line EML disposed in the second horizontal area HA2 may be reduced. A difference in RC loads between the scan signal line SCL disposed in the first horizontal area HA1 and the scan signal line SCL disposed in the second horizontal area HA2 may be reduced. A difference in RC loads between the initialization signal line IVL disposed in the first horizontal area HA1 and the initialization signal line IVL disposed in the second horizontal area HA2 may be reduced.

In the display panel 110 of the display device 100 according to aspects of the present disclosure, the first transmission area TA1 in which the resistive compensation pattern RCP formed on the first horizontal line HL1 and the capacitive compensation pattern CCPs formed on the first vertical line VL1 are disposed to overlap with each other can be identified through the presence or absence of the cathode electrode CE and/or the light shield layer LS.

In a case where a metal is present in the first transmission area TA1 in which the cathode electrode CE and/or the light shield layer LS are not disposed, this metal can be regarded as a resistive compensation pattern RCP and a capacitive compensation pattern CCP.

As described above, the display panel 110 according to aspects of the present disclosure can include the RC load difference compensation structure (the resistive compensation pattern, and/or the capacitive compensation pattern) formed in the first optical area OA1 of the display area DA of the display panel 110.

The display panel 110 according to aspects of the present disclosure can further include an RC load difference compensation structure (a resistive compensation pattern, and/or a capacitive compensation pattern) formed in the second optical area OA2 of the display area DA of the display panel 110. Hereinafter, the RC load difference compensation structure (the resistive compensation pattern, and/or the capacitive compensation pattern) formed in the second optical area OA2 will be described with reference to FIGS. 15, 16, 17A and 17B.

Figure 15:
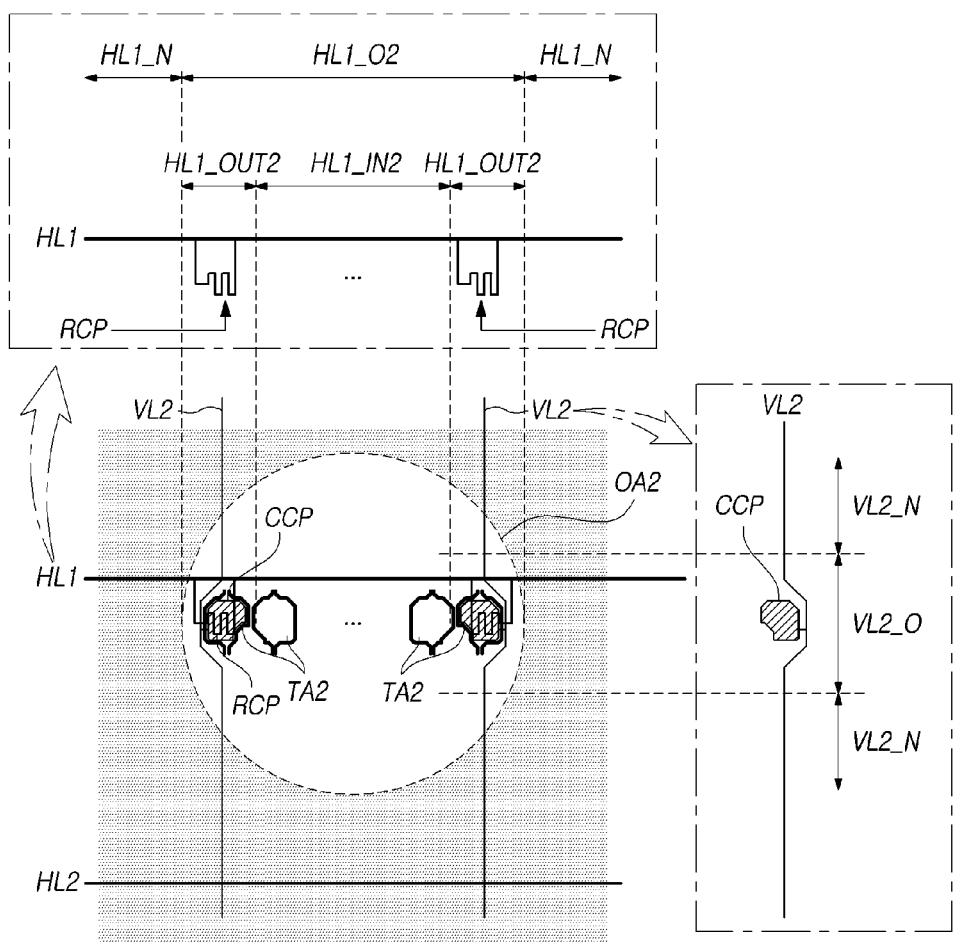
FIG. 15 illustrates an RC load difference compensation structure between the first horizontal line running through the second optical area and the second horizontal line not running through the second optical area in the display panel according to aspects of the present disclosure.

FIG. 15 illustrates an RC load difference compensation structure between a first horizontal line running through the second optical area and a second horizontal line not running through the second optical area OA2 in the display panel 110 according to aspects of the present disclosure.

Referring to FIG. 15, in some aspects, in a case where the display device 100 further includes the second optical electronic device 12 located under, at a lower portion of, the display panel 110 as shown in FIGS. 1B and 1C, the first horizontal line HL1 may run through the second optical area OA2 as well as the first optical area OA1.

Referring to FIG. 15, the display area DA of the display panel 110 may further include the second optical area OA2 different from the first optical area OA1 and the normal area NA. The second optical area OA2 may be located adjacent to the first optical area OA1 in the horizontal direction in the display area DA.

The second optical electronic device 12 may be located under, or at a lower portion of, the display panel 110 and overlap with at least a portion of the second optical area OA2. For example, the second optical electronic device 12 may include a camera, a sensor, and the like.

In the display panel 110, the normal area NA may be, or may not be, disposed between the first optical area OA1 and the second optical area OA2.

As illustrated in FIG. 1B, the first optical area OA1 and the second optical area OA2 may be separated from each other, in this example, the normal area NA may be present between the first optical area OA1 and the second optical area OA2.

As illustrated in FIG. 1C, the first optical area OA1 and the second optical area OA2 may contact each other, in this example, the normal area NA may not be present between the first optical area OA1 and the second optical area OA2. In this case, the first optical area OA1 and the second optical area OA2 may be regard as being present together in one optical area.

Referring to FIG. 15, the second optical area OA2 may include a plurality of lighting emitting areas EA and a plurality of second transmission areas TA2.

Referring to FIG. 15, the second optical area OA2 may be located in the horizontal direction with respect to the first optical area OA1. In this case, the first horizontal line HL1 may further include a second optical horizontal line portion HL1_O2 disposed in the second optical area OA2, in addition to the first optical horizontal line portion HL1_O1 and the non-optical horizontal line portion HL1_N.

Referring to FIG. 15, the second optical horizontal line portion HL1_O2, which is a portion of the first horizontal line HL1 disposed in the second optical area OA2, may include a second outer horizontal line portion HL1_OUT2 and a second inner horizontal line portion HL1_IN2.

Referring to FIG. 15, in the second optical horizontal line portion HL1_O2 of the first horizontal line HL1, the second outer horizontal line portion HL1_OUT2 may be disposed in an outer area of the second optical area OA2.

Referring to FIG. 15, in the second optical horizontal line portion HL1_O2 of the first horizontal line HL1, the second inner horizontal line portion HL1_IN2 may be located inside of the second outer horizontal line portion HL1_OUT2 in the second optical area OA2.

Referring to FIG. 15, the second optical horizontal line portion HL1_O2 of the first horizontal line HL1 may further include a resistive compensation pattern (RCP) connected to the second outer horizontal line portion HL1_OUT2, which is a portion of the first horizontal line HL1 located in the outer area of the second optical area OA2.

Referring to FIG. 15, the resistive compensation pattern RCP connected to the portion of the first horizontal line HL1 located in the outer area of the second optical area OA2 may be disposed in at least one second transmission area TA2 disposed in the outer area of the second optical area OA2 among second transmission areas TA2 in the second optical area OA2.

For example, the resistive compensation pattern RCP disposed in the outer area of the second optical area OA2 may have one or more of a zigzag shape, a spiral shape, and a mesh shape.

Referring to FIG. 15, one or more second vertical lines VL2 intersecting the first horizontal line HL1 may be further included in the display panel 110 according to aspects of the present disclosure. For example, the second vertical line VL2 may be a driving voltage line DVL for supplying a driving voltage ELVDD to sub-pixels SP. In another example, the second vertical line VL2 may be a data line DL for supplying a data voltage Vdata to a sub-pixels SP. In FIG. 15, the second vertical line VL2 is illustrated as the driving voltage line DVL.

The second vertical line VL2 may be disposed in the normal area NA and the second optical area OA2. The second vertical line VL2 may include a second optical vertical line portion VL2_O disposed in the second optical area OA2, and a second non-optical vertical line portion VL2_N disposed in the normal area NA.

Referring to FIG. 15, the second vertical line VL2 may further include a capacitive compensation pattern CCP. For example, the capacitive compensation pattern CCP may be a portion resulting from the expanding of the second optical vertical line portion VL2_O, or a portion protruding from the second optical vertical line portion VL2_O, or may be a pattern electrically connected to the second optical vertical line portion VL2_O.

Referring to FIG. 15, the capacitive compensation pattern CCP included in the second vertical line VL2 may overlap with the resistive compensation pattern RCP formed in the first horizontal line HL1. Accordingly, a capacitance value formed in the first horizontal line HL1 may increase, and thus an RC value of the first horizontal line HL1 may increase.

As described above, since the first horizontal line HL1 is a signal line running through the second optical area OA2 and the second horizontal line HL2 is a signal line disposed only in the normal area NA, a length of the first horizontal line HL1 may be different from a length of the second horizontal line HL2. For example, the length of the first horizontal line HL1 may be greater than the length of the second horizontal line HL2.

Thus, although a difference in length between the first horizontal line HL1 and the second horizontal line HL2 is present, when the RC load difference compensation technique according to aspects of the present disclosure is applied, an RC value of the second horizontal line HL2 may be substantially the same as an RC value of the first horizontal line HL1.

Figure 16:
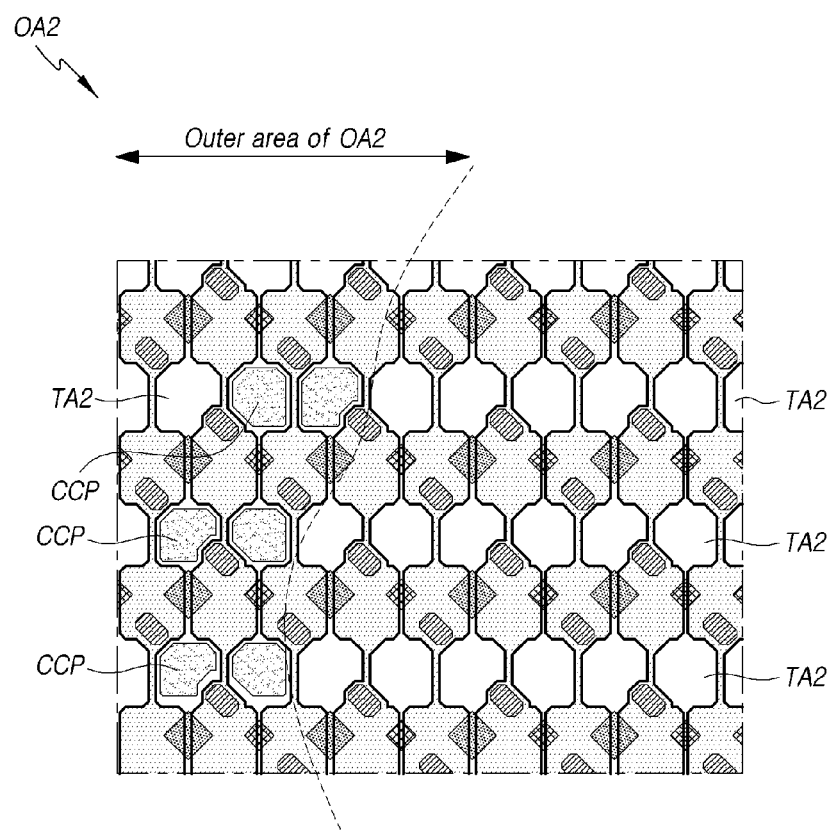
FIG. 16 illustrates an outer area of the second optical area to which the RC load difference compensation structure of FIG. 15 is applied.
Figure 17A:
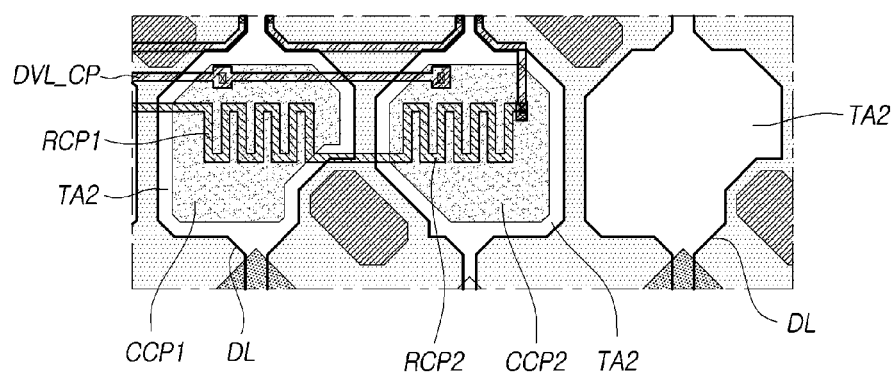
FIGS. 17A and 17B are enlarged views of the second transmission area in which the resistive compensation pattern and the capacitive compensation pattern of FIG. 16 are formed.
Figure 17B:
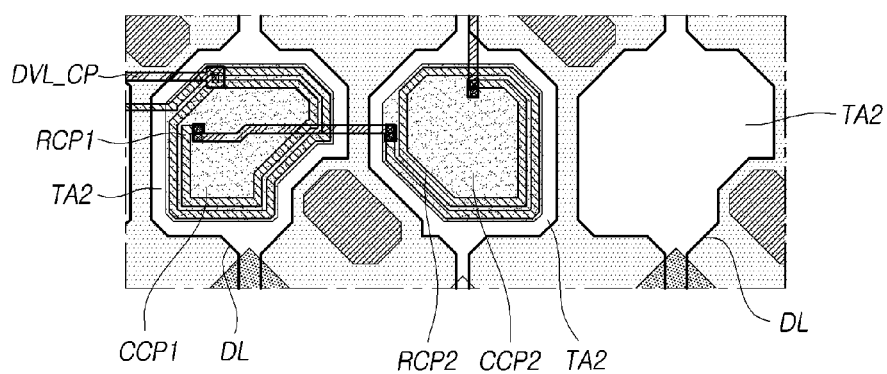

FIG. 16 illustrates an outer area of the second optical area OA2 to which the RC load difference compensation structure of FIG. 15 is applied. FIGS. 17A and 17B are enlarged views of the second transmission area in which the resistive compensation pattern RCP and the capacitive compensation pattern CCP of FIG. 16 are formed.

Referring to FIGS. 16, 17A, and 17B, for example, each of a red sub-pixel Red SP, a green sub-pixel Green SP, and a blue sub-pixel Blue SP disposed in the second optical area OA2 can receive a gate signal through the first horizontal lines HL1.

Referring to FIGS. 16, 17A, and 17B, the first horizontal lines HL1 may run through the second optical area OA2, as well as the normal area NA and the first optical area OA1.

Referring to FIGS. 16, 17A, and 17B, one or more resistive compensation patterns (RCP1, RCP2) and one or more capacitive compensation patterns (CC1, CCP2) may be disposed in each of second transmission areas TA2 disposed in the outer area of the second optical area OA2.

Referring to FIGS. 16, 17A, and 17B, the one or more resistive compensation patterns (RCP1, RCP2) disposed in each second transmission area TA2 disposed in the outer area of the second optical area OA2 may be connected to the first horizontal line HL1.

A portion of the first horizontal line HL1 not disposed in the second transmission area TA2 may include a first material, and the resistive compensation patterns RCP1 and RCP2 may include a second material.

Referring to FIGS. 17A and 17B, two resistive compensation patterns RCP1 and RCP2 connected to one first horizontal line HL1 may be respectively disposed into two second transmission areas TA2 disposed in one or more outer areas of the second optical area OA2.

Referring to FIGS. 17A and 17B, the first resistive compensation pattern RCP1 and the second resistive compensation pattern RCP2 respectively disposed in two second transmission areas TA2 disposed in the one or more outer areas of the second optical area OA2 may be electrically connected to each other.

Referring to FIGS. 16, 17A, and 17B, the capacitive compensation patterns (CCP1, CCP2) respectively disposed in the second transmission areas TA2 disposed in the one or more outer areas of the second optical area OA2 may be connected to the second vertical line VL2 through a connection pattern DVL_CP.

For example, the second vertical line VL2 may be a driving voltage line DVL for supplying a driving voltage ELVDD to a sub-pixel SP. In another example, the second vertical line VL2 may be a data line DL for supplying a data voltage Vdata to a sub-pixels SP. Referring to FIGS. 17A, and 17B, the second vertical line VL2 is illustrated as the driving voltage line DVL.

Referring to FIGS. 17A and 17B, two capacitive compensation patterns (CCP1, CCP2) connected to one second vertical line VL2 may be respectively disposed in two second transmission areas TA2 disposed in the one or more outer areas of the second optical area OA2.

Referring to FIGS. 17A and 17B, the first capacitive compensation pattern CCP1 and the second capacitive compensation pattern CCP2 respectively disposed in two second transmission areas TA2 disposed in the one or more outer areas of the second optical area OA2 may be electrically connected to each other.

Referring to FIG. 17A, each of two resistive compensation patterns (RCP1, RCP2) connected to one first horizontal line HL1 may be disposed in a zigzag shape.

Referring to FIG. 17B, each of two resistive compensation patterns (RCP1, RCP2) connected to one first horizontal line HL1 may be disposed in a spiral shape.

As described above, the resistive compensation patterns (RCP1, RCP2) connected to the first horizontal line HL1 are disposed in such a manner that the corresponding line has an increased length per unit area (e.g., a zigzag shape, a spiral shape, a mesh shape, etc.), this leading the first horizontal line HL1 to have an increased resistance value. Further, as an overlapping area between the first horizontal line HL1 and the second vertical line VL2 increase, therefore, a capacitance value formed in the first horizontal line HIL1 may increase. Accordingly, an RC value of the first horizontal line HL1 may increase. As a result, the increased RC value of the first horizontal line HL1 may become similar to the RC value of the second horizontal line HL2, and in turn, a difference in RC loads may be reduced.

FIGS. 18A to 18H illustrate example resistive compensation patterns that can be disposed in an outer area of the first optical area OA1 in the display panel 110 according to aspects of the present disclosure.

In order to compensate for a difference in RC loads, the resistive compensation pattern RCP formed on the first horizontal line HL1 may be disposed on at least one first transmission area TA1 disposed in the outer area of the first optical area OA1.

Referring to FIGS. 18A to 18H, the resistive compensation pattern RCP may have at least one of a zigzag shape, a spiral shape, a mesh shape, and the like.

Figure 18A:
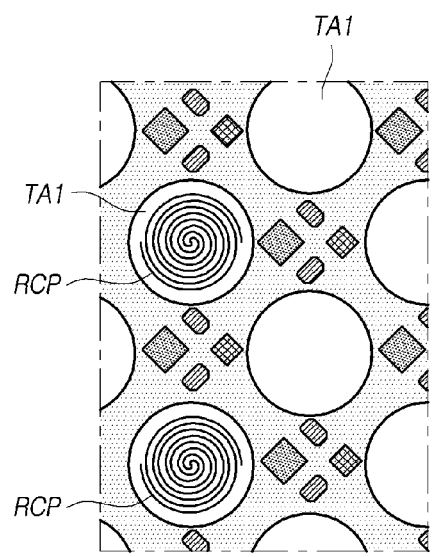
FIGS. 18A to 18H illustrate example resistive compensation patterns that can be disposed in an outer area of the first optical area in the display panel according to aspects of the present disclosure.
Figure 18B:
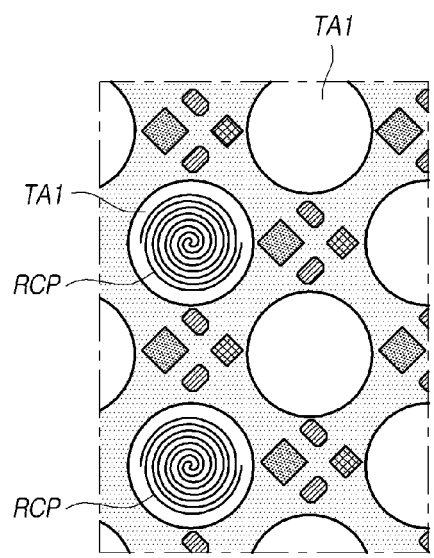

As illustrated in FIGS. 18A and 18B, the resistive compensation pattern RCP of the first horizontal line HL1 may have a round spiral shape. Referring to FIG. 18A, the resistive compensation pattern RCP of the first horizontal line HL1 may have the round spiral shape turning in the first direction. Referring to FIG. 18B, the resistive compensation pattern RCP of the first horizontal line HL1 may have the round spiral shape that turns in a direction different from the first direction.

Figure 18C:
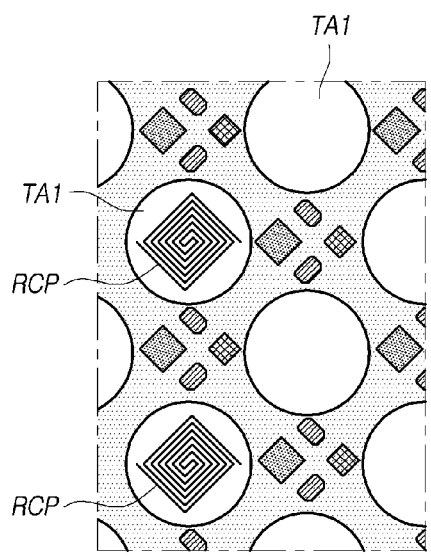
Figure 18D:
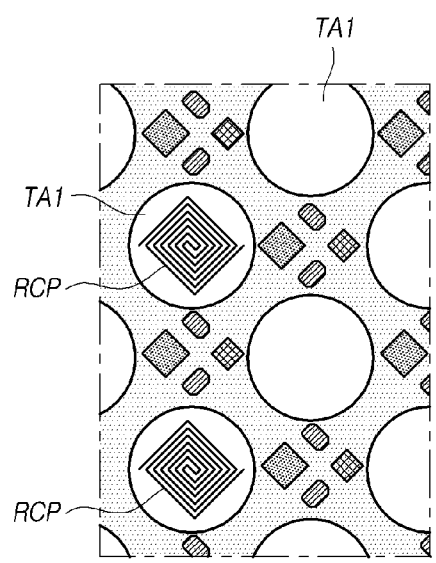
Figure 18E:
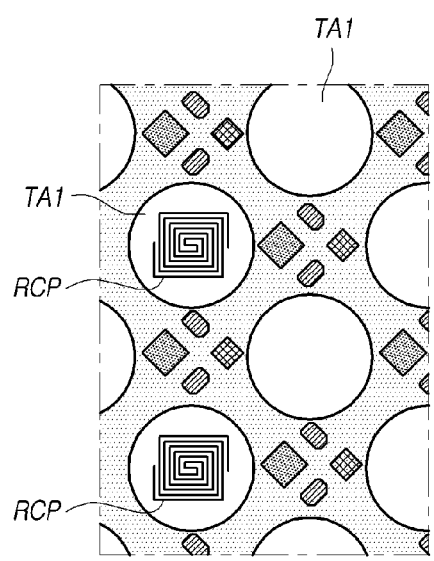

As illustrated in FIGS. 18C, 18D and 18E, the resistive compensation pattern RCP of the first horizontal line HL1 may have an angular spiral shape different from such a circular shape. The resistive compensation pattern RCP with the angular spiral shape in FIG. 18C and the resistive compensation pattern RCP with the angular spiral shape in FIG. 18D may turn in directions opposite to each other.

Figure 18F:
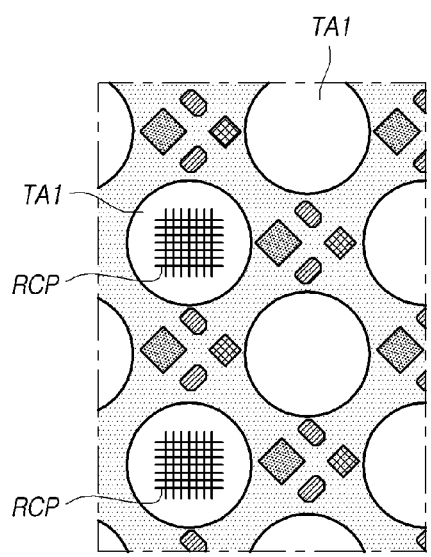
Figure 18G:
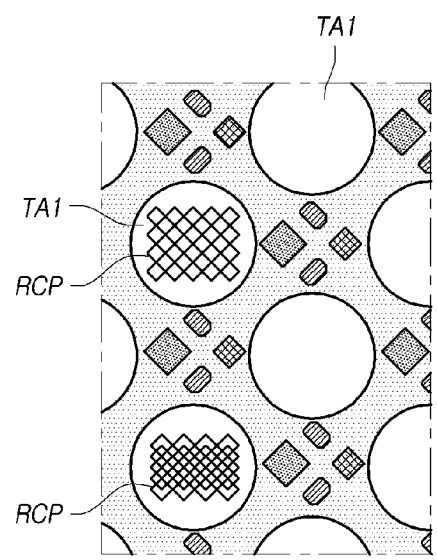
Figure 18H:
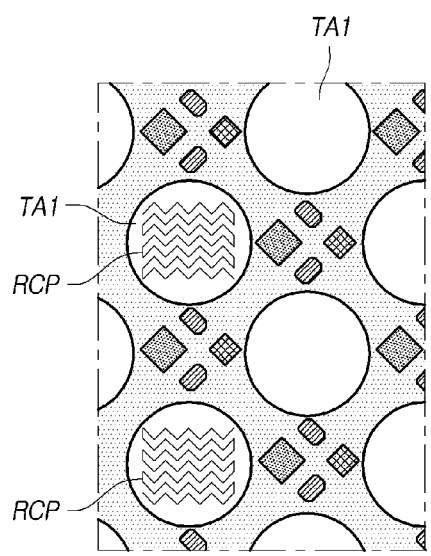

As illustrated in FIGS. 18F and 18G, the resistive compensation pattern RCP of the first horizontal line HL1 may have various mesh shapes. As illustrated in FIG. 18H, the resistive compensation pattern RCP of the first horizontal line HL1 may have various zigzag shapes.

As described above, the display panel 110 according to the aspects described herein can include the substrate SUB including the display area DA and the non-display area NDA, and a plurality of signals disposed on the substrate SUB.

The display area DA may include a first optical area OA1 at least partially overlapping with a first optical electronic device 11 located under the substrate SUB and a normal area NA located outside of the first optical areas OA1.

The first optical area OA1 may include a plurality of light emitting areas EA and a plurality of first transmission areas TAL. The normal area NA may include a plurality of light emitting areas EA.

The plurality of signal lines may include a first signal line HL1 including a first optical signal line portion HL1_O1 and a non-optical signal line portion HL1_N.

The first signal line HL1 may be the above-mentioned first horizontal line HL1 and may be a vertical line depending on a viewing direction.

The first optical signal line portion HL1_O1 may be disposed in the first optical area OA1. The non-optical signal line portion HL1_N may be disposed in the normal area NA.

The first optical signal line portion HL1_O1 of the first signal line HL1 may include a first portion not overlapping with a cathode electrode and a second portion overlapping with the cathode electrode.

The first portion may be the above-mentioned first outer horizontal line portion HL1_OUT1. The second portion may be the above-mentioned first inner horizontal line portion HL1_IN1.

In the first optical signal line portion HL1_O1 of the first signal line HL1, the first portion may be located in a first transmission area TA1 in which the cathode electrode CE is not disposed.

In the first optical signal line portion HL1_O1 of the first signal line HL1, the second portion may be located in a light emitting area EA in which the cathode electrode CE is disposed.

A length per unit area of the first portion may be greater than a length per unit area of the second portion, or a width of the first portion may be smaller than a width of the second portion.

The first portion may be a portion located in an outer area of the first optical area OA1. Accordingly, the first portion may be located closer to an outer edge of the first optical area OA1 than the second portion.

Figure 19A:
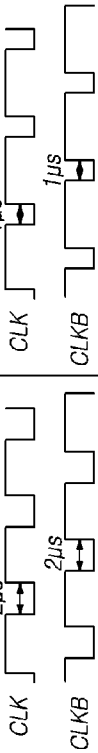
FIG. 19A illustrates a scan signal in a situation where an RC load difference compensation structure is not applied in the display panel according to aspects of the present disclosure.
Figure 19B:
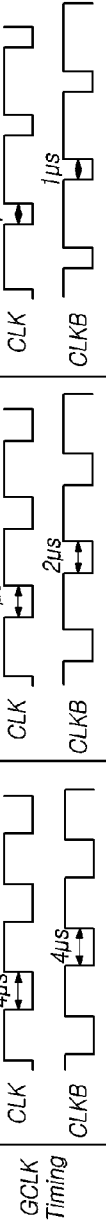
FIG. 19B illustrates a scan signal in a situation where an RC load difference compensation structure is applied in the display panel according to aspects of the present disclosure.

FIG. 19A illustrates scan signals (SCAN(n−1), SCAN(n)) in a situation where an RC load difference compensation structure is not applied to the display panel 110 according to aspects of the present disclosure. FIG. 19B illustrates scan signals (SCAN(n−1), SCAN(n)) in a situation where an RC load difference compensation structure is applied to the display panel 110.

Referring to FIGS. 19A and 19B, the gate driving circuit 230 can generate an (n−1)-th scan signal SCAN(n−1) and an n-th scan signal SCAN(n) based on a first clock signal CLK and a second clock signal CLKB, which are gate clock signals GCLK, and output the generated scan signals to a first gate line and a second gate line.

Referring to FIGS. 19A and 19B, as the (n−1)-th scan signal SCAN(n−1) and the n-th scan signal SCAN(n) generated based on the first clock signal CLK and the second clock signal CLKB are supplied to subpixels SP, the initial operation and sampling operation of the subpixels SP can proceed. For purposes of clarity, it is assumed that driving transistors DRT in the sub-pixels SP are p-type transistors.

During an initial operation period, the (n−1)th scan signal SCAN(n−1) may have a low level voltage. During a sampling operation period, the n-th scan signal SCAN(n) may have a low level voltage. During the initial operation period, a gate voltage DRG of the driving transistor DRT may decrease, and during the sampling operation period, a gate voltage DRG of the driving transistor DRT may increase.

Referring to FIGS. 19A and 19B, Case 1 is a case where sampling time is 4 µs, Case 2 is a case where sampling time is 2 µs, and Case 3 is a case where sampling time is 1 µs.

Discussions will be given on whether a difference in RC loads occurs and a magnitude of the RC load difference in each of these three cases by comparing a gate voltage DRG of a driving transistor DRT in a sub-pixel SP connected to the first and second gate lines when the first and second gate lines are disposed in the first horizontal area HA1, and a gate voltage DRG of a driving transistor DRT in a sub-pixel SP connected to the first and second gate lines when the first and second gate lines are disposed in the second horizontal area HA2.

Referring to FIG. 19A, when an RC load difference compensation structure is not applied to the display panel 110, in Case 1 where the sampling time is greater than 2 µs, there occurs no substantial difference between a gate voltage DRG of the driving transistor DRT in the sub-pixel SP located in the first horizontal area HA1, and a gate voltage DRG of the driving transistor DRT in the sub-pixel SP located in the second horizontal area HA2. That is, in Case 1 where the sampling time is greater than 2 µs, a substantial RC load difference does not occur.

Referring to FIG. 19A, when an RC load difference compensation structure is not applied to the display panel 110, in Case 2 or Case 3 where the sampling time is less than or equal to 2 µs, there may occur a difference between a gate voltage DRG of the driving transistor DRT in the sub-pixel SP located in the first horizontal area HA1, and a gate voltage DRG of the driving transistor DRT in the sub-pixel SP located in the second horizontal area HA2. That is, in Case 2 or Case 3 where the sampling time is less than or equal to 2 µs, an RC load difference may occur.

When an RC load difference compensation structure is not applied to the display panel 110, an RC load difference may occur greater in Case 3 where the sampling time is less than 2 µs compared to Case 2 where the sampling time equals to 2 µs.

Accordingly, image quality abnormality may occur due to an initialization or sampling difference from the sampling time of 2 µs or less, and as the sampling time reduces, such image quality abnormality may occur more significantly. Therefore, when being driven at a high frequency, RC load difference compensation is increasingly needed.

Referring to FIG. 19B, when an RC load difference compensation structure is applied to the display panel 110, in Case 1 where the sampling time is greater than 2 µs, a substantial RC load difference does not occur. A substantial RC load difference does not occur even Cases 2 and 3 where the sampling time is 2 µs or less.

Therefore, for all sampling times, image quality abnormality due to an RC load difference can be prevented. That is, even when being driven at a high frequency, such an RC load difference can be compensated and excellent image quality can be provided According to the aspects described herein, the display panel 110 and display device 100 can be provided that, by locating the optical electronic devices (11, 12) such as a camera, a sensor, and the like under, at a lower portion of, the display area DA of the display panel 110, are capable of reducing a size of the non-display area NDA of the display panel 110, and enabling the optical electronic devices (11, 12) not to be exposed in the front surface of the display device 100.

According to the aspects described herein, the display panel 110 and the display device 100 can be provided that have the light transmission structure for enabling the optical electronic devices (11, 12) under the display area DA, or at a lower portion, of the display panel 110 to normally receive light transmitting the display panel 110.

According to the aspects described herein, the display panel 110 and the display device 100 can be provided capable of normally implementing display driving in the optical areas (OA1, OA2) included in the display area DA of the display panel 110 and overlapping with the optical electronic devices (11, 12).

According to the aspects described herein, the display panel 110 and the display device 100 can be provided that, in a case where the display area of the display panel includes the optical areas (OA1, OA2) overlapping with the optical electronic devices (11, 12) and the normal area not overlapping with the optical electronic devices (11, 12), have the RC load difference compensation structure between a signal line (the first horizontal line) disposed in the optical areas (OA1, OA2) and a signal line (the second horizontal line) disposed in the normal area.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device comprising:
    a display panel that comprises a display area, a non-display area and a plurality of signal lines,
    wherein the display area includes a first optical area and a normal area located outside the first optical area,
    wherein the first optical area includes a plurality of light emitting areas and a plurality of first transmission areas,
    wherein the plurality of signal lines includes:
    a first horizontal line including a first optical horizontal line portion disposed in the first optical area and a non-optical horizontal line portion disposed in the normal area; and
    a second horizontal line disposed in the normal area and not disposed in the first optical area,
    wherein the first optical horizontal line portion of the first horizontal line includes:
    a first outer horizontal line portion disposed in an outer area within the first optical area, and
    a first inner horizontal line portion located inside the first outer horizontal line portion in the first optical area; and
    wherein a length per unit area of the first outer horizontal line portion is greater than a length per unit area of the first inner horizontal line portion, or greater than a length per unit area of the non-optical horizontal line portion, or a width of at least a portion of the first horizontal line is smaller than a width of the second horizontal line.

2. The display device according to claim 1, wherein the first inner horizontal line portion is disposed to avoid the plurality of first transmission areas in the first optical area, and
    wherein the first outer horizontal line portion is disposed in at least one first transmission area disposed in the outer area within the first optical area among the plurality of first transmission areas in the first optical area.

3. The display device according to claim 1, wherein the first outer horizontal line portion comprises a resistive compensation pattern having a different shape or a different width from the first inner horizontal line portion.

4. The display device according to claim 3, wherein the resistive compensation pattern has one of a zigzag shape, a spiral shape and a mesh shape.

5. The display device according to claim 3, wherein the plurality of signal lines further comprises a first vertical line intersecting the first horizontal line,
    wherein the first vertical line comprises a first optical vertical line portion disposed in the first optical area, and a first non-optical vertical line portion disposed in the normal area, and further comprises a capacitive compensation pattern formed by the expanding or protruding of the first optical vertical line portion, and
    wherein at least a portion of the capacitive compensation pattern overlaps with the resistive compensation pattern.

6. The display device according to claim 1, wherein the first outer horizontal line portion and the first inner horizontal line portion are located in different layers from each other.

7. The display device according to claim 1, wherein the display area further comprises a second optical area different from the first optical area and the normal area, and
    wherein the normal area is disposed or not disposed between the first optical area and the second optical area.

8. The display device according to claim 7, wherein the second optical area comprises a plurality of light emitting areas and a plurality of second transmission areas,
    wherein the first horizontal line further comprises a second optical horizontal line portion disposed in the second optical area, in addition to the first optical horizontal line portion and the non-optical horizontal line portion,
    wherein the second optical horizontal line portion comprises a second outer horizontal line portion disposed in an outer area within the second optical area, and a second inner horizontal line portion located inside of the second outer horizontal line portion, and
    wherein the second optical horizontal line portion further comprises a resistive compensation pattern connected to the second outer horizontal line portion.

9. The display device according to claim 8, wherein the resistive compensation pattern is disposed in at least one second transmission area disposed in the outer area within the second optical area among the plurality of second transmission areas in the second optical area.

10. The display device according to claim 8, wherein the resistive compensation pattern has one of a zigzag shape, a spiral shape, and a mesh shape.

11. The display device according to claim 8, wherein the plurality of signal lines further comprises a second vertical line intersecting the second horizontal line,
    wherein the second vertical line comprises a second optical vertical line portion disposed in the second optical area, and a second non-optical vertical line portion disposed in the normal area, and further comprises a capacitive compensation pattern, and
    wherein the capacitive compensation pattern is a portion resulting from the expanding of the second optical vertical line portion, a portion protruding from the second optical vertical line portion, or a pattern electrically connected to the second optical vertical line portion, and overlaps with the resistive compensation pattern.

12. The display device according to claim 7, further comprising at least one of a first optical electronic device overlapping with at least a portion of the first optical area and a second optical electronic device overlapping with at least a portion of the second optical area, and
    wherein the first optical electronic device is a camera, and the second optical electronic device is a sensor.

13. The display device according to claim 7, wherein a transmittance of the first optical area is equal to or greater than a transmittance of the second optical area, or
    a number of subpixels per unit area in the first optical area is smaller than a number of subpixels per unit area in the normal area, and a number of subpixels per unit area in the second optical area is greater than or equal to the number of subpixels per unit area in the first optical area.

14. The display device according to claim 1, wherein the first horizontal line and the second horizontal line are signal lines for transmitting a same type of signal, and
    wherein a length of the first horizontal line is greater than a length of the second horizontal line, and an RC value of the second horizontal line is a same as an RC value of the first horizontal line.

15. The display device according to claim 1, wherein the display panel further comprises a cathode electrode disposed in the plurality of light emitting areas included in the normal area and the first optical area and not disposed in the plurality of first transmission areas in the first optical area.

16. The display device according to claim 1, wherein the display panel further comprises a light shield layer disposed under transistors in the plurality of light emitting areas and not disposed in the plurality of first transmission areas.

17. A display panel comprising:
    a substrate including a display area and a non-display area; and
    a plurality of signal lines disposed over the substrate,
    wherein the display area comprises a first optical area and a normal area located outside the first optical area,
    wherein the first optical area comprises a plurality of light emitting areas and a plurality of first transmission areas, and the normal area comprises a plurality of light transmission areas,
    wherein the plurality of signal lines comprises a first signal line comprising a first optical signal line portion disposed in the first optical area and a non-optical signal line portion disposed in the normal area,
    wherein the first optical signal line portion of the first signal line comprises a first portion not overlapping with a cathode electrode and a second portion overlapping with the cathode electrode, and
    wherein a length per unit area of the first portion is greater than a length per unit area of the second portion, or a width of the first portion is smaller than a width of the second portion.

18. A display panel comprising:
- a plurality of signal lines including a plurality of horizontal lines and a plurality of vertical lines located in non-display area; and
- at least one optical area and normal area located in display area of the display panel, the at least one optical area including a plurality of light transmission areas, the normal area not including the light transmission area;
- wherein at least a part of at least one horizontal line of the plurality of horizontal lines is disposed in at least one light transmission area of the at least one optical area, and a length per unit area of the at least one part of the at least one horizontal line is greater than the length per unit area of other parts thereof, or width of the at least one part of the at least one horizontal line is smaller than that of other parts thereof, thereby forming a resistive compensation pattern, and
- at least a part of at least one vertical line of the plurality of vertical lines is expanded or protruded to form a capacitive compensation pattern.

19. The display panel of claim 18, wherein the resistive compensation pattern overlaps with the capacitive compensation pattern.

20. A display device comprising:
- a display panel according to claim 18;
- wherein the plurality of horizontal lines is a plurality of gate lines and the plurality of vertical lines is a plurality of data lines intersecting with the plurality of gate lines, respectively;
- a data driving circuit that drives the plurality of data lines and provides data signals to the plurality of data lines,
- a gate drive circuit that drives the plurality of gate lines and provides a gate signal to the plurality of gate lines; and
- a display controller configured to provide a data driving control signal to the data driving circuit to control the data driving circuit, and provides a gate driving control signal to the gate driving circuit to control the gate driving circuit.

* * * * *